United States Patent [19]

Gomi

[11] Patent Number: 5,858,850

[45] Date of Patent: Jan. 12, 1999

[54] PROCESS OF FABRICATING INTEGRATED HETEROJUNCTION BIPOLAR DEVICE AND MIS CAPACITOR

[75] Inventor: Takayuki Gomi, Tokyo, Japan

[73] Assignee: Sony Corporation, Tokyo, Japan

[21] Appl. No.: 909,813

[22] Filed: Aug. 12, 1997

[30] Foreign Application Priority Data

Aug. 14, 1996 [JP] Japan ..................................... 8-214437
Jan. 14, 1997 [JP] Japan ..................................... 9-004266

[51] Int. Cl.$^6$ ................................................. H01L 21/331
[52] U.S. Cl. ........................ 438/314; 438/329; 438/393; 438/396; 257/572; 257/577
[58] Field of Search ..................... 438/314, 329, 438/396, 165, 220, 430, 393; 257/572, 577

[56] References Cited

U.S. PATENT DOCUMENTS

| | | | |
|---|---|---|---|
| 5,336,632 | 8/1994 | Imamura | 437/60 |
| 5,407,841 | 4/1995 | Liao et al. | 437/31 |
| 5,409,846 | 4/1995 | Hirose | 437/31 |
| 5,414,291 | 5/1995 | Miwa et al. | 257/370 |
| 5,622,887 | 4/1997 | Miwa et al. | 438/202 |
| 5,641,692 | 6/1997 | Miwa et al. | 438/236 |

FOREIGN PATENT DOCUMENTS

| | | | |
|---|---|---|---|
| 362268336 | 11/1987 | Japan | 438/227 |
| 404259239 | 9/1992 | Japan | 438/227 |

*Primary Examiner*—Peter Toby Brown
*Assistant Examiner*—Long Pham
*Attorney, Agent, or Firm*—Hill & Simpson

[57] ABSTRACT

A process of fabricating a semiconductor device includes the steps of: forming a base layer of a bipolar transistor (NPN bipolar transistor) on a semiconductor base body by selective epitaxial growth; and forming a dielectric film of a MIS capacitor on the same semiconductor base body. In this process, when side walls for isolating a base electrode connected to the base layer from an emitter layer formed on the base layer are formed, the dielectric film is formed of a silicon nitride film which is the same as one of films constituting the side walls. Thus, a MIS capacitor can be thus formed on one substrate together with a bipolar transistor only by adding the minimum number of steps to the steps of forming the bipolar transistor.

8 Claims, 32 Drawing Sheets

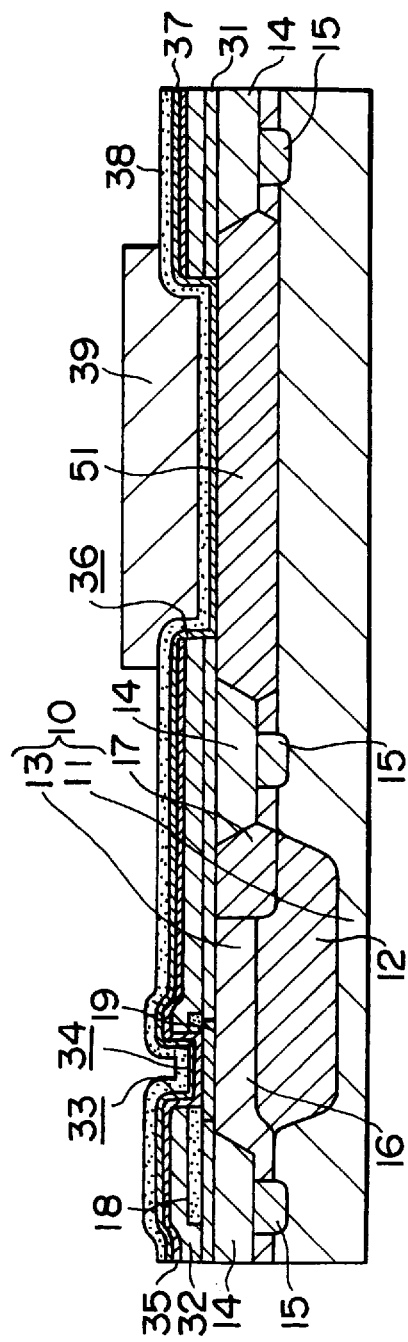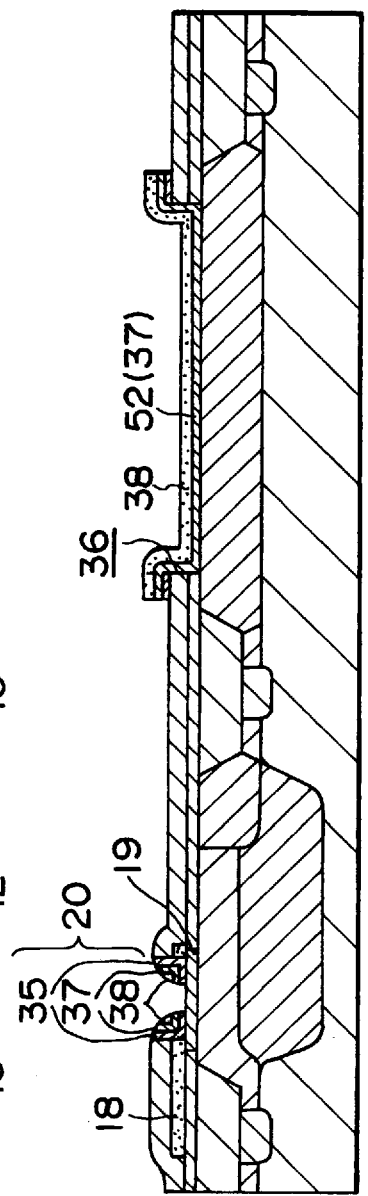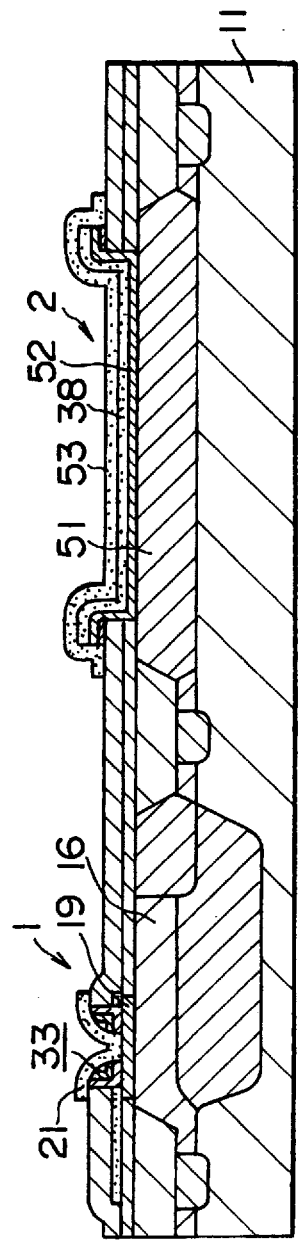

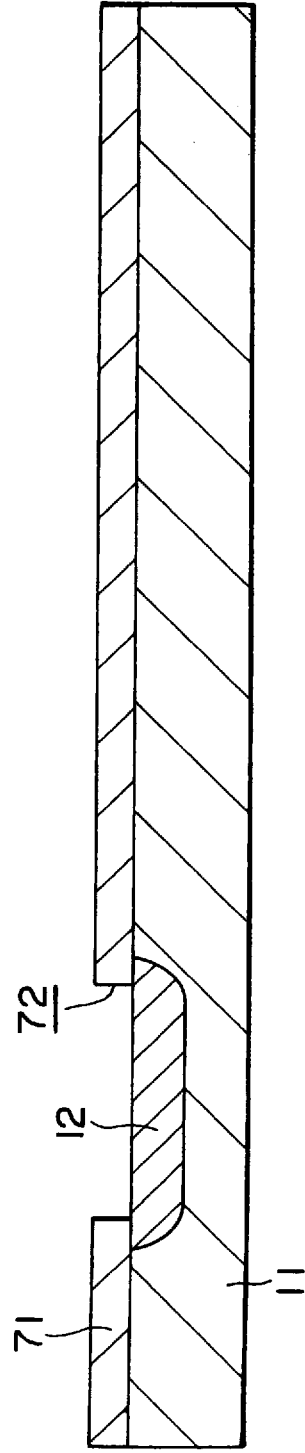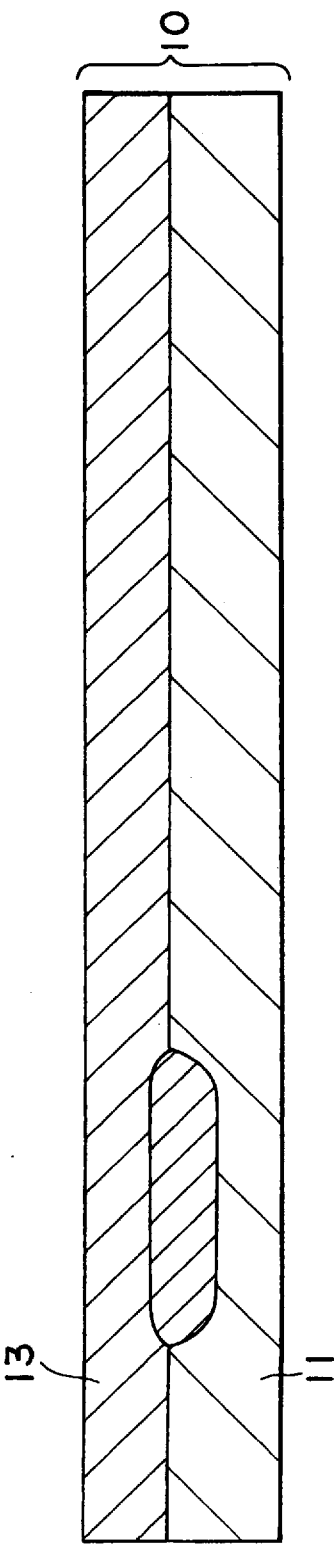

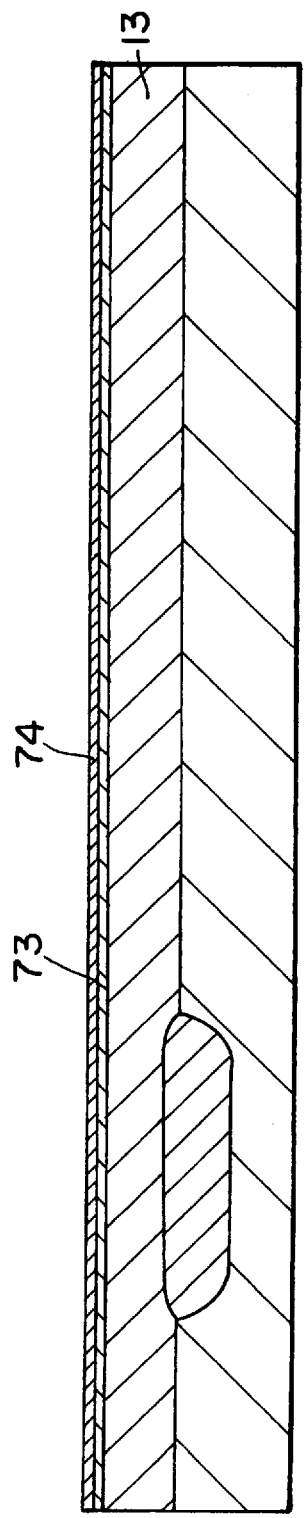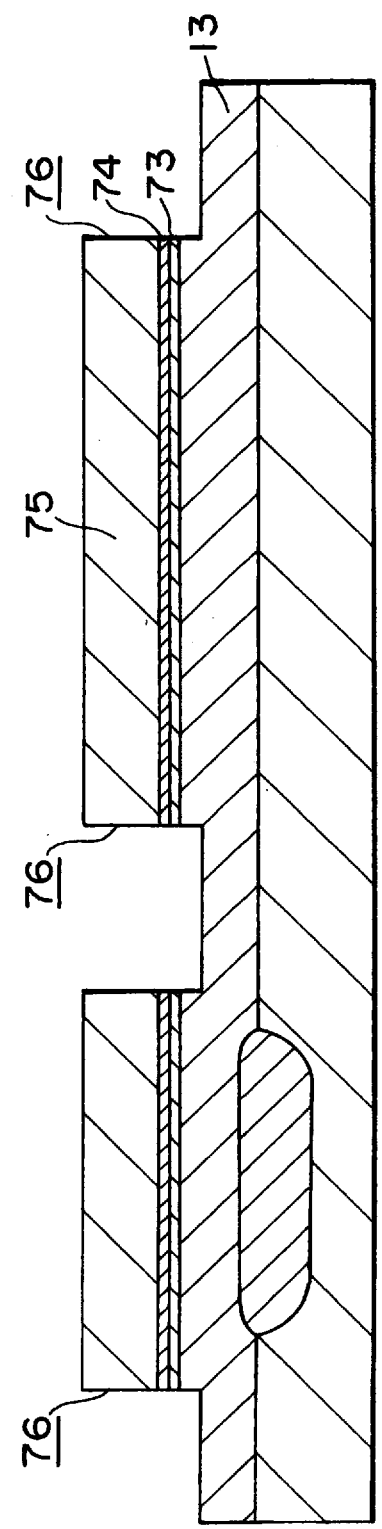

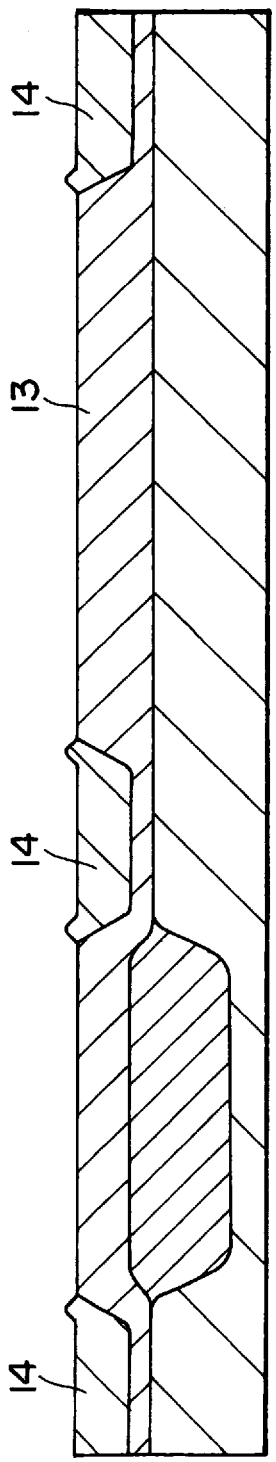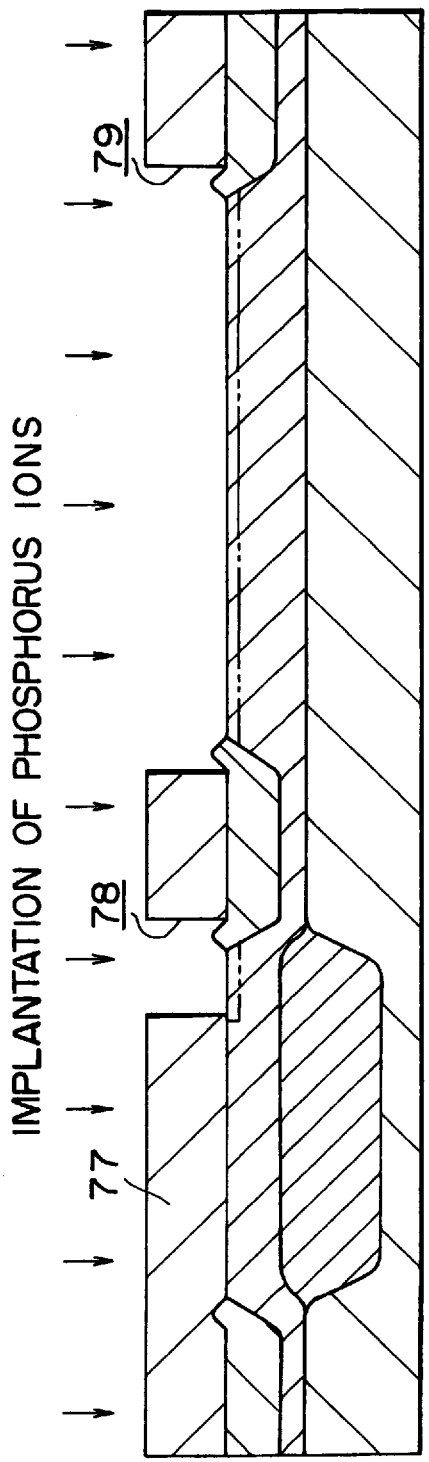

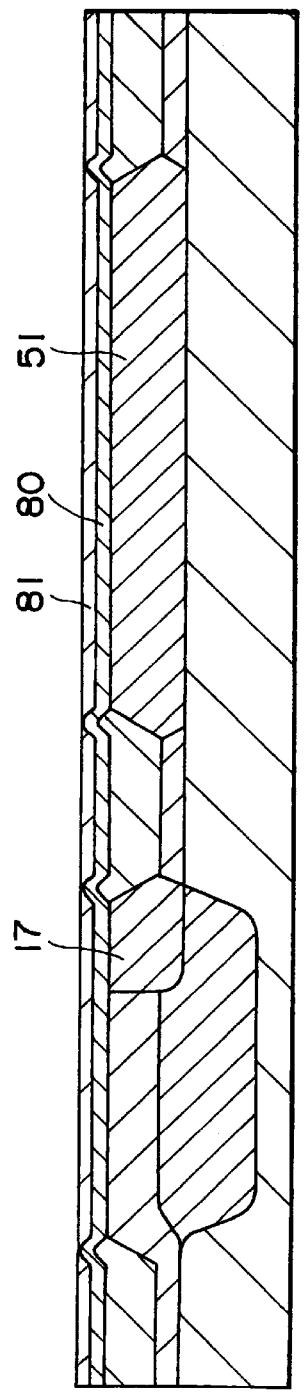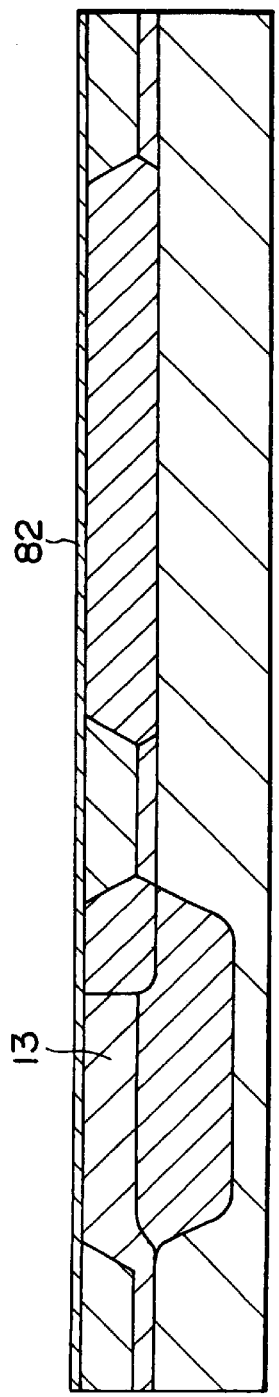

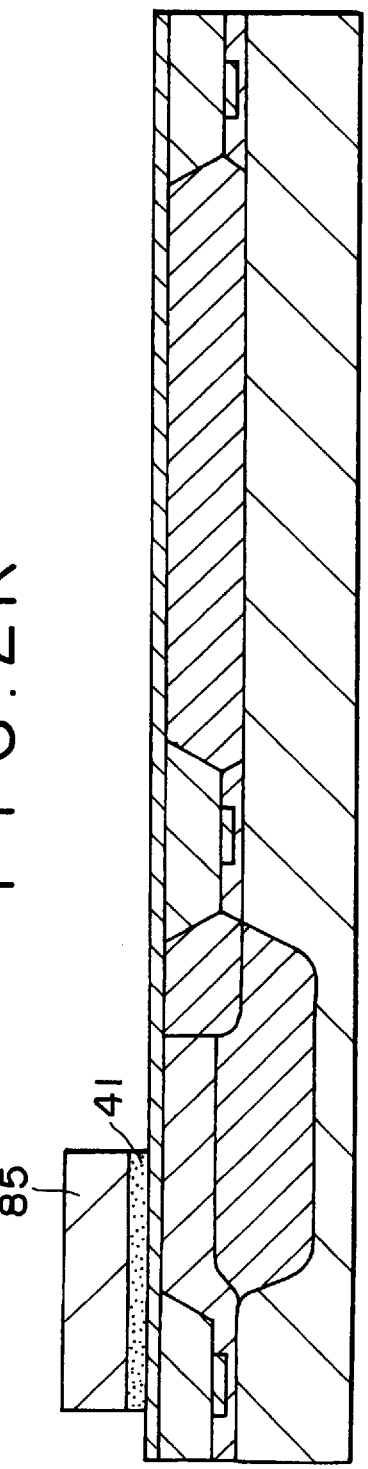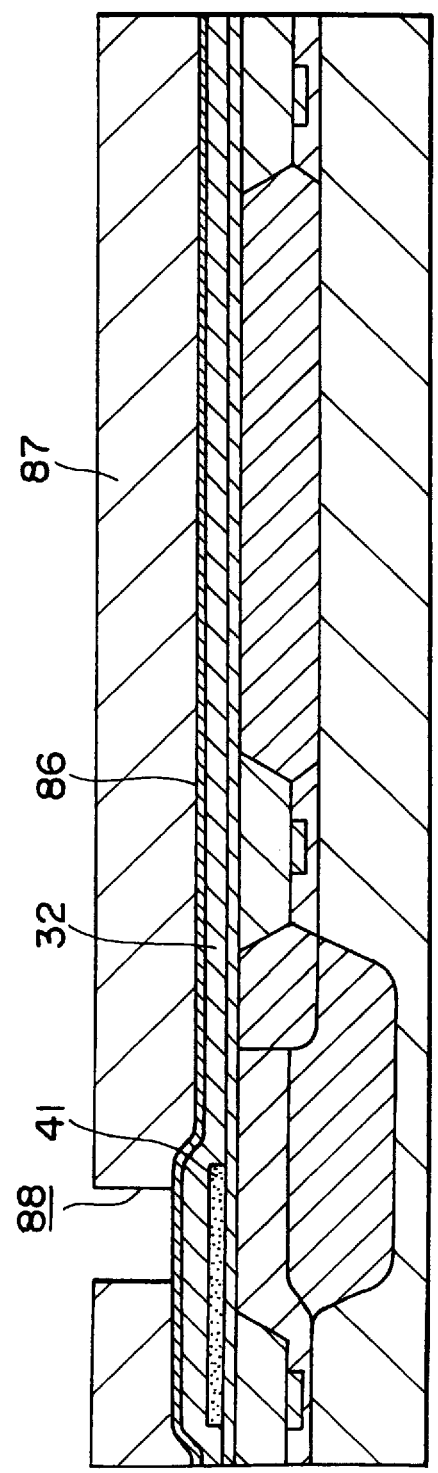

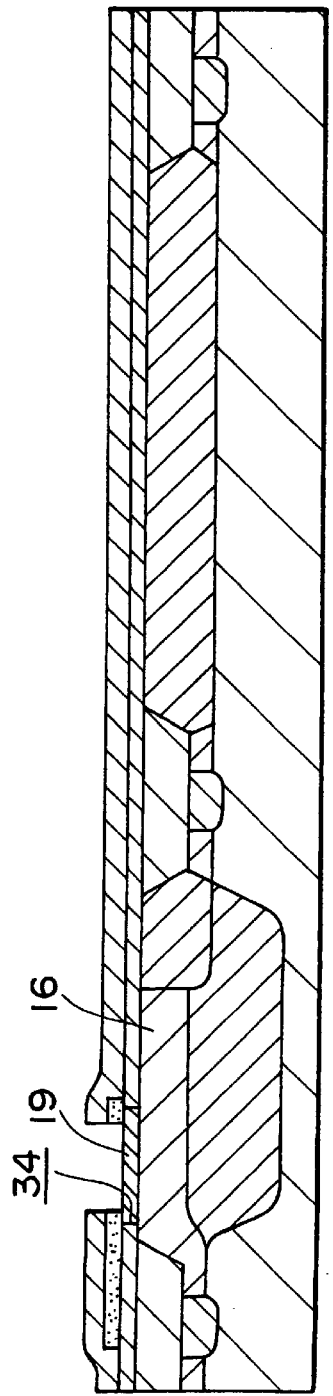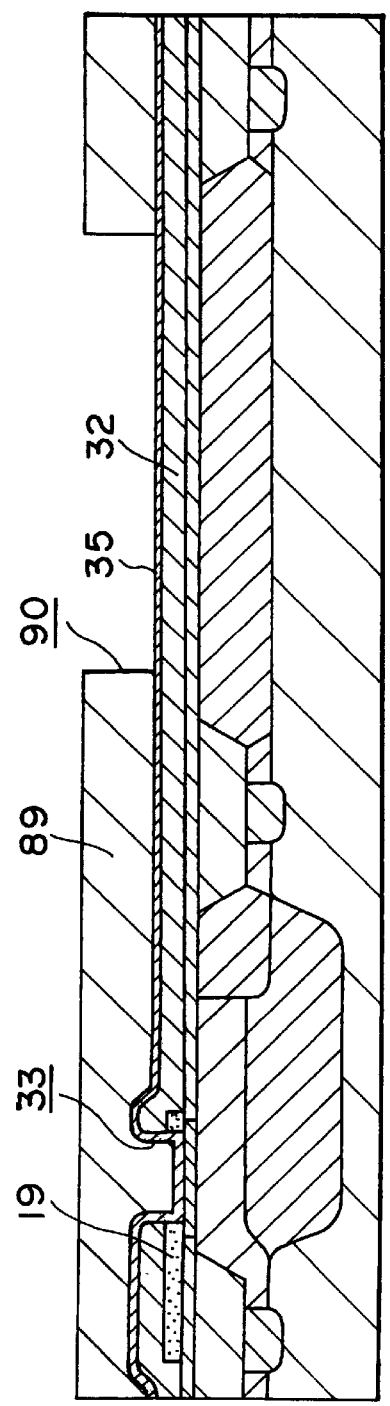

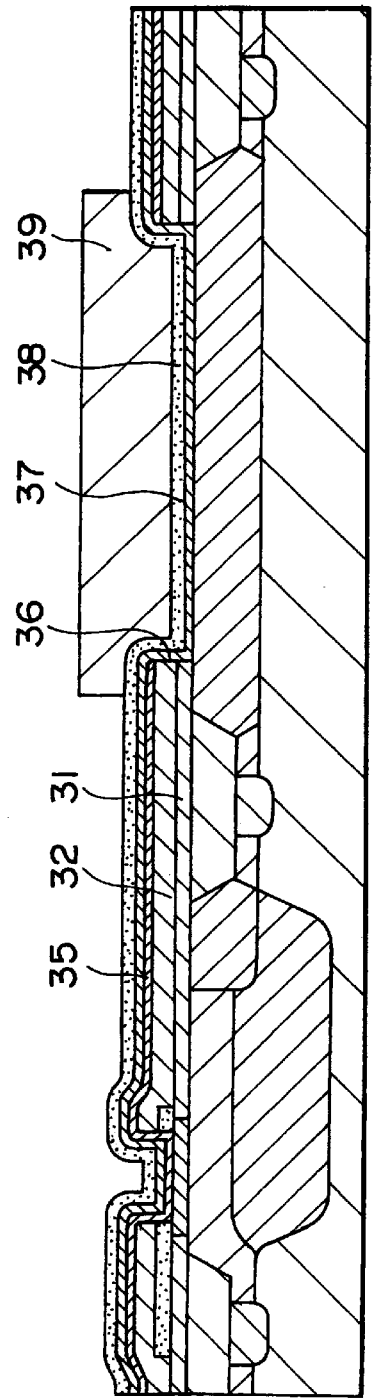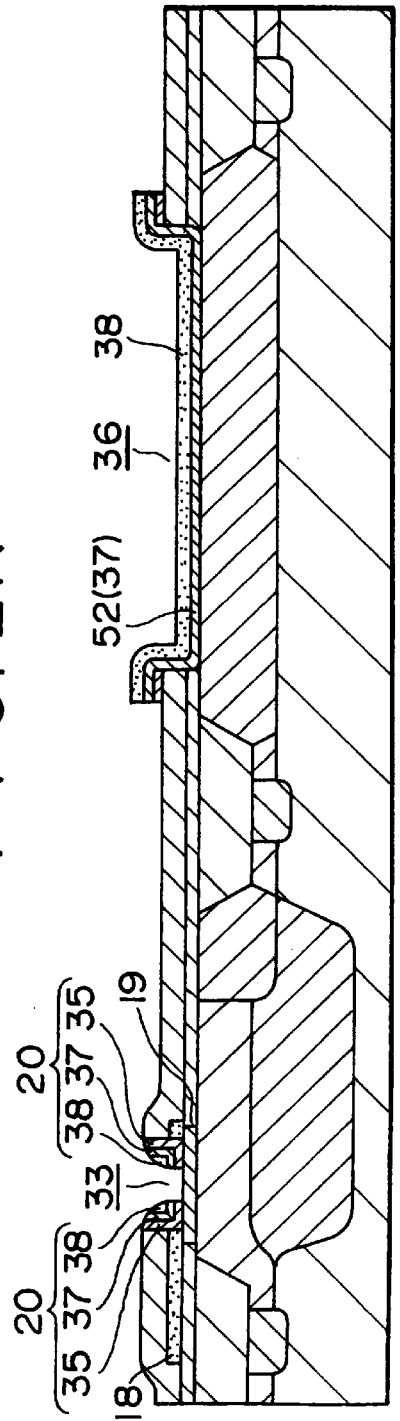

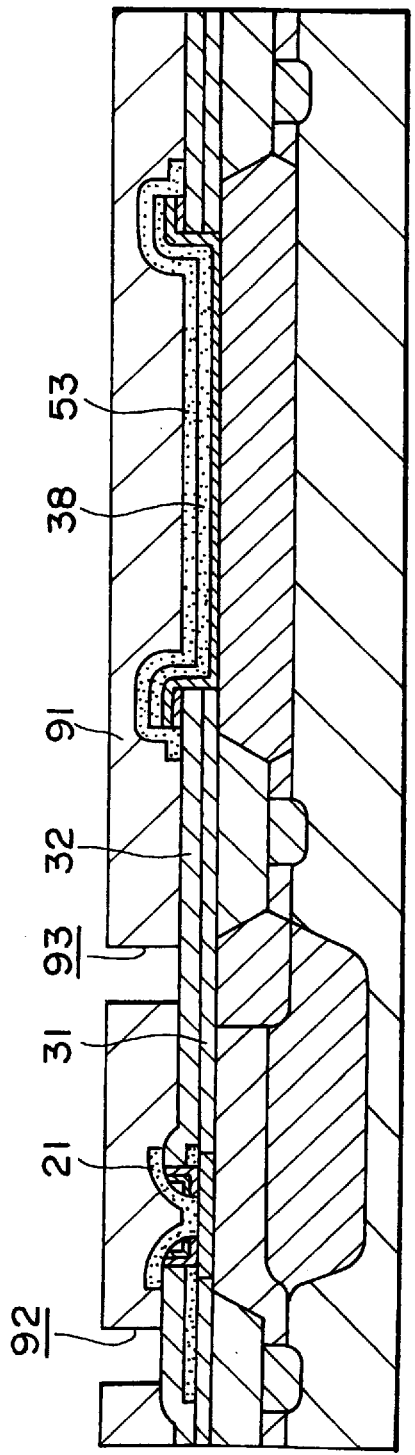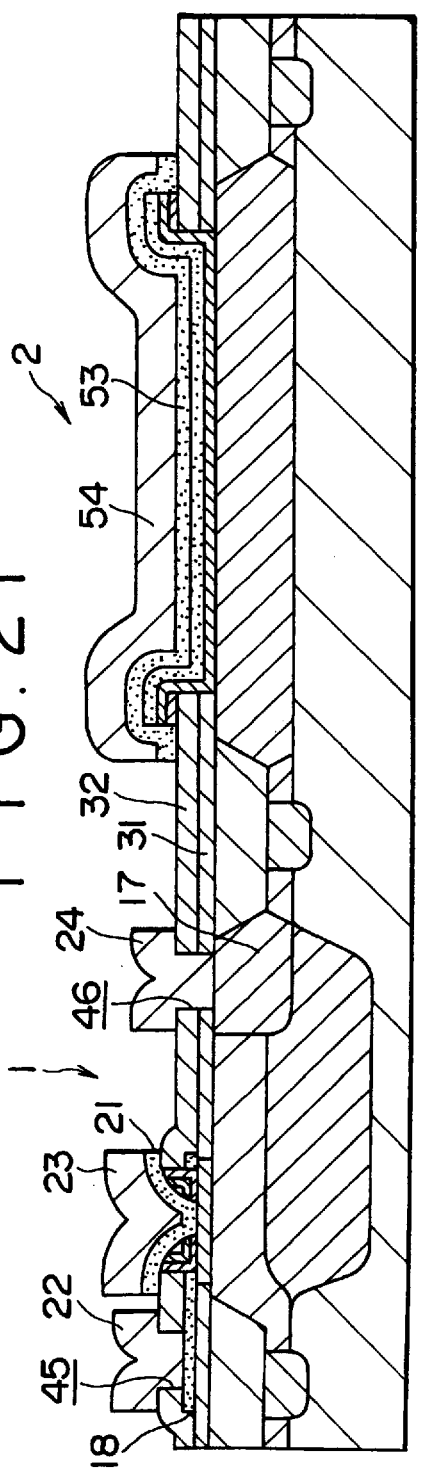

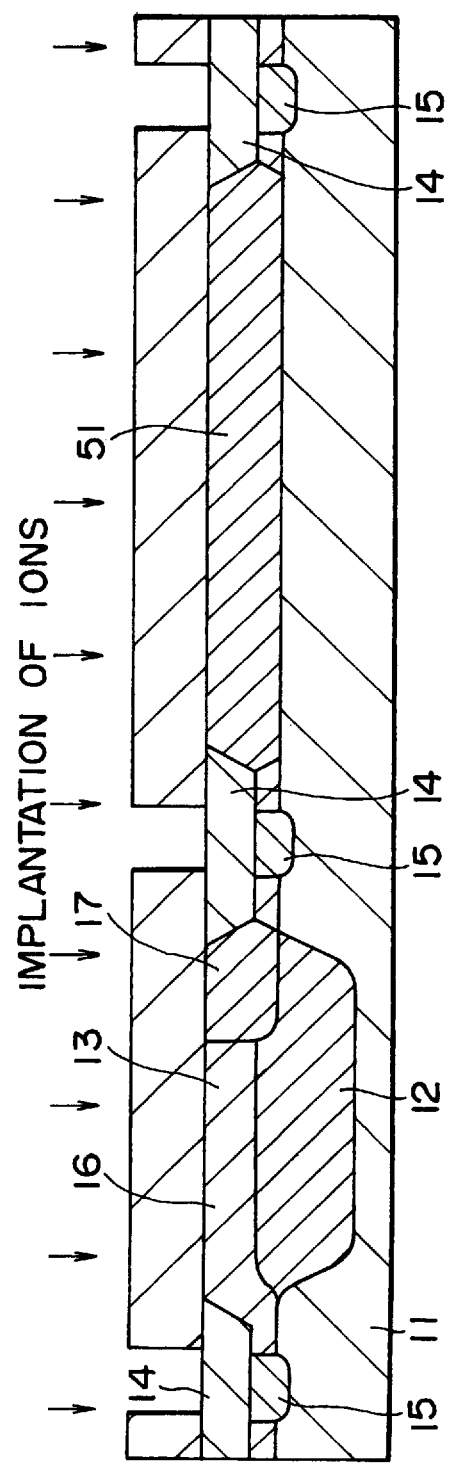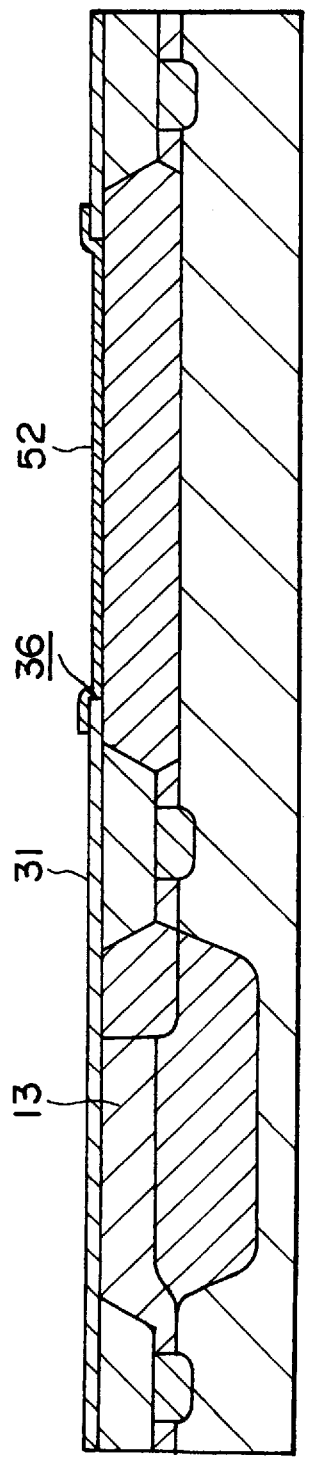

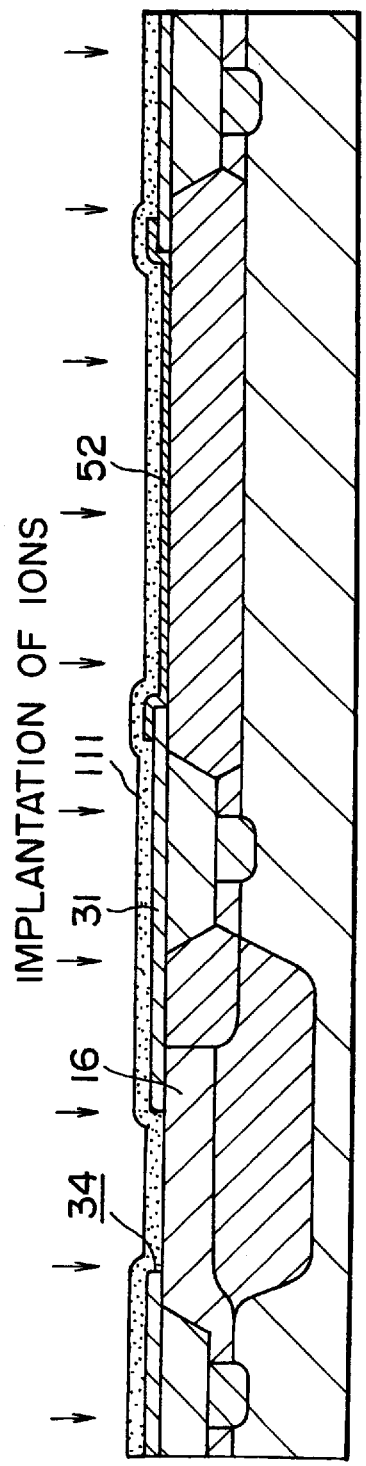
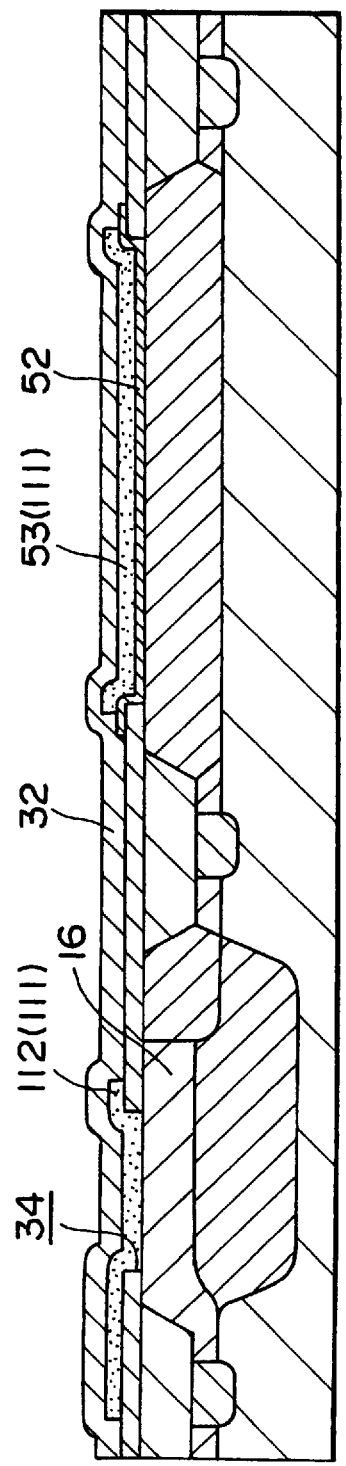

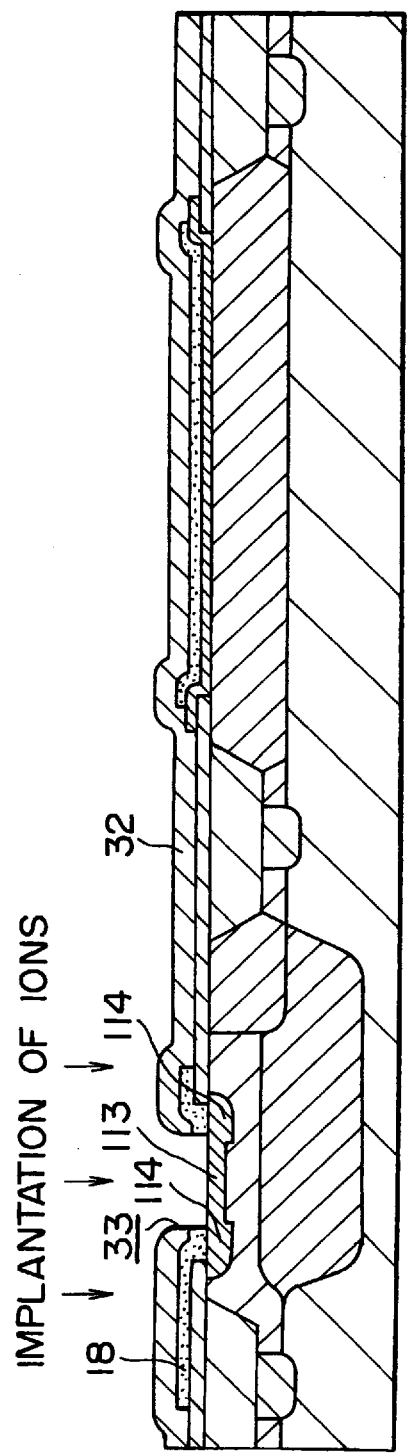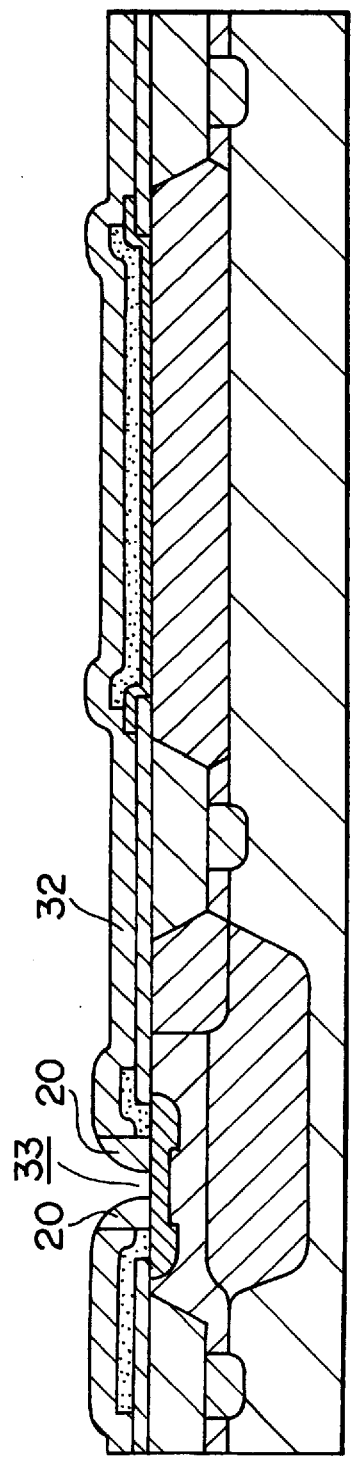

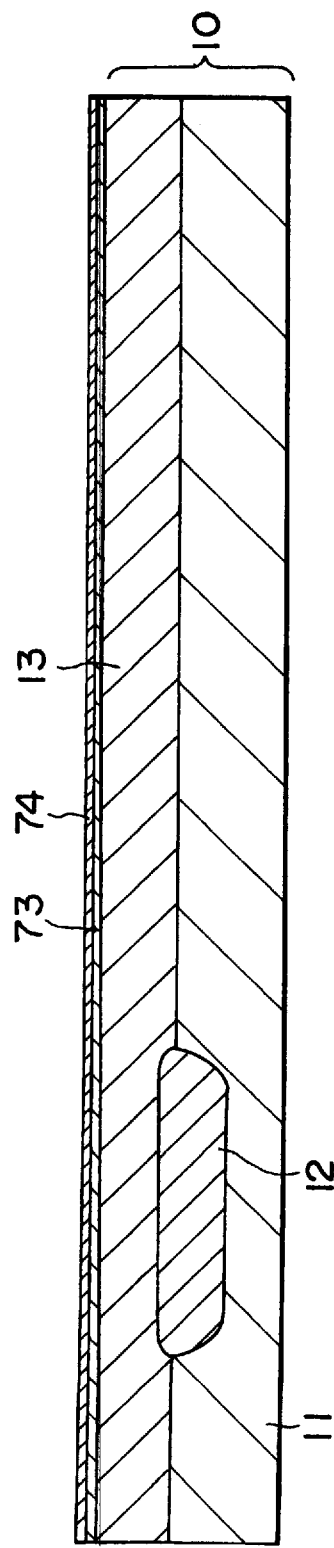
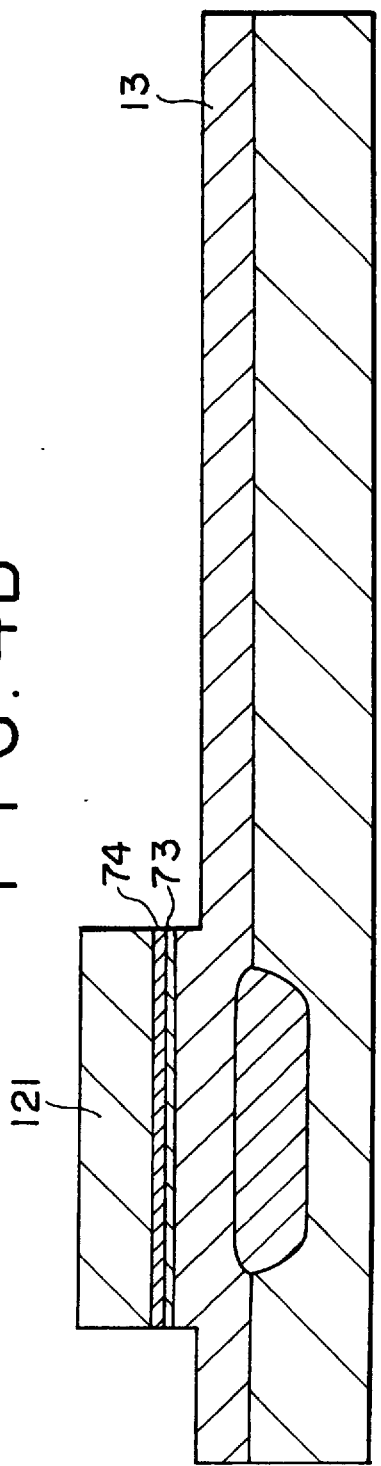

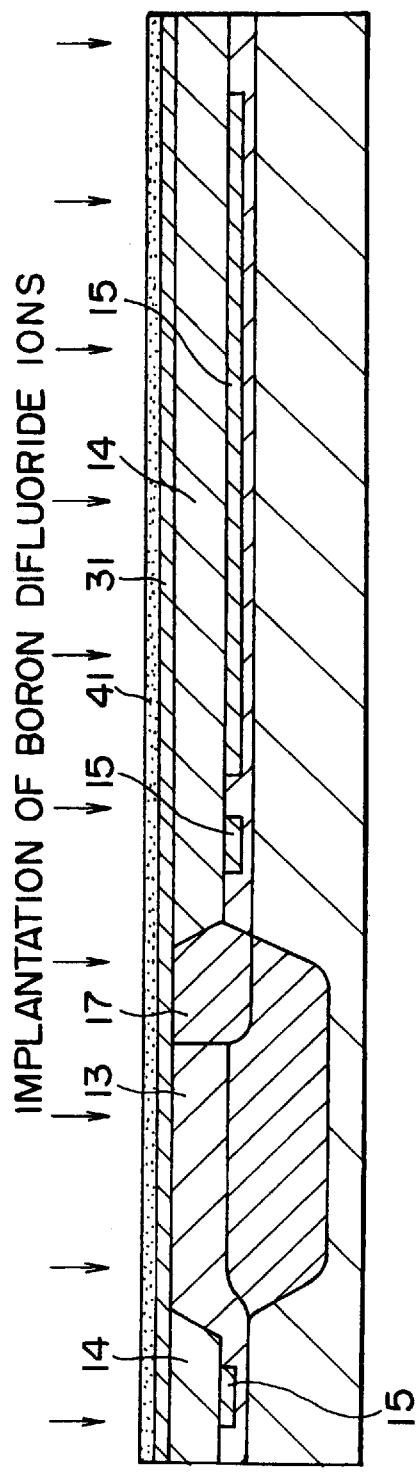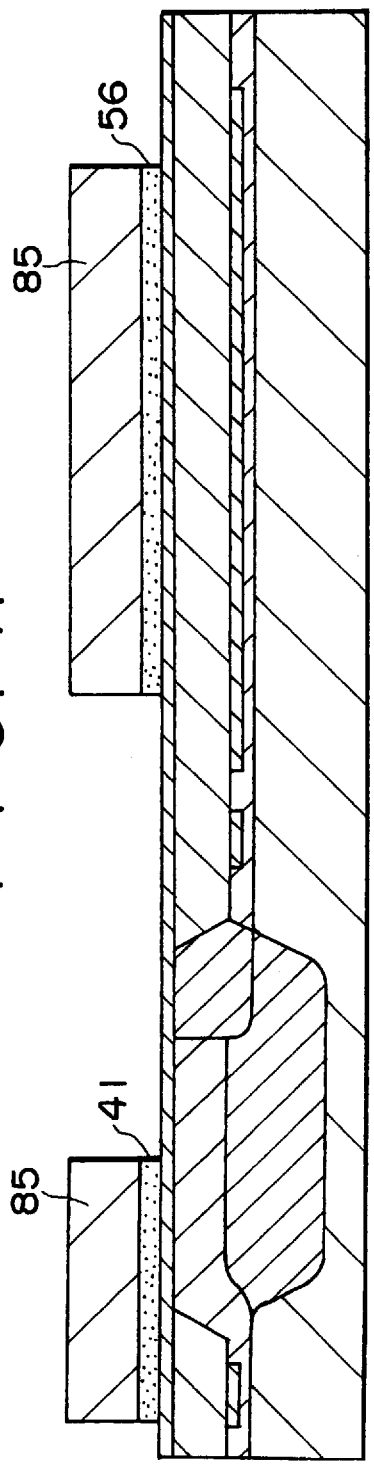

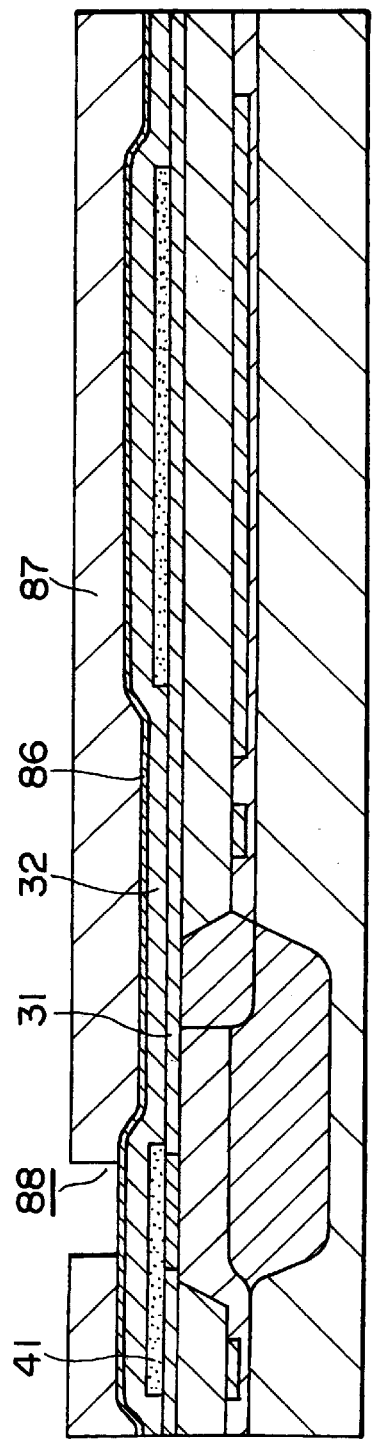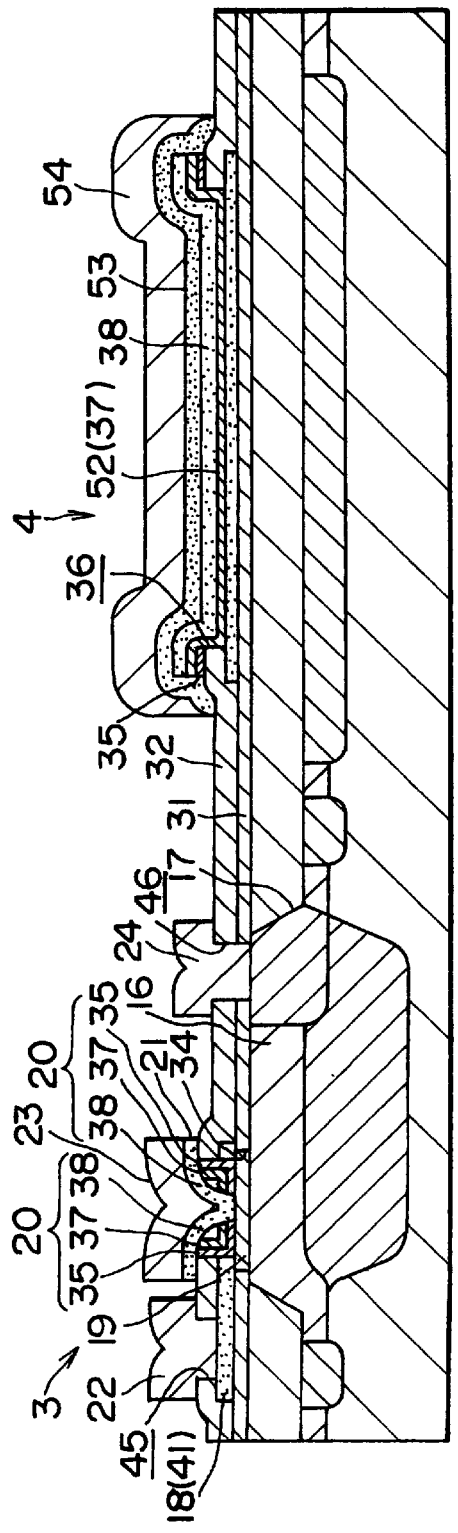

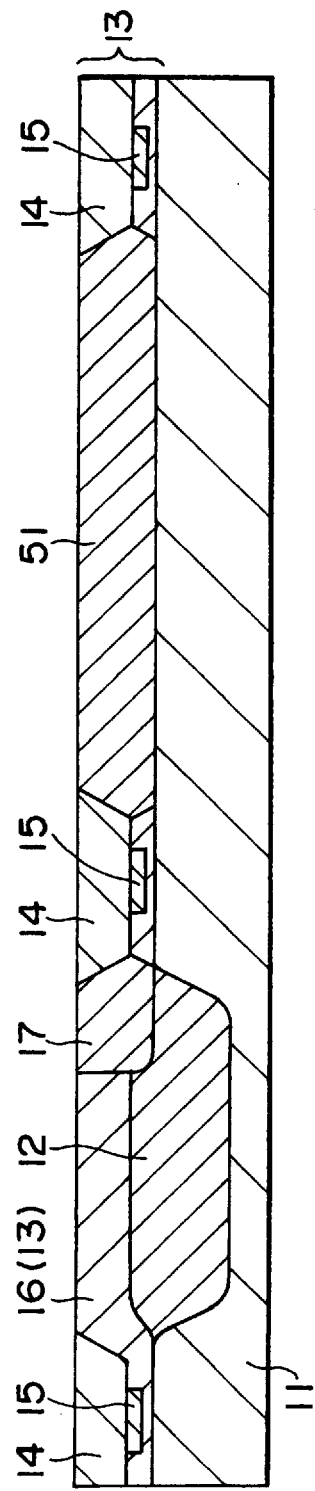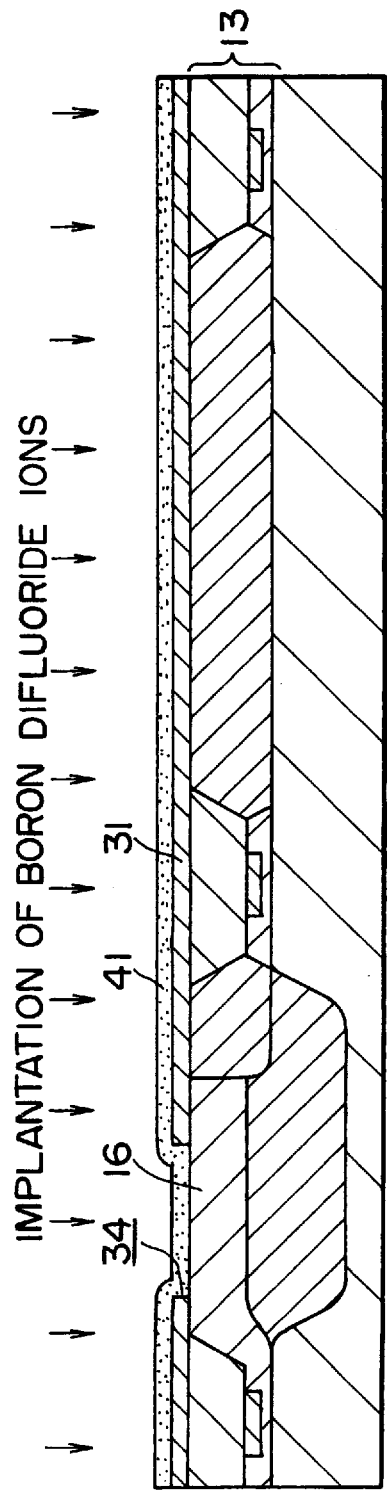

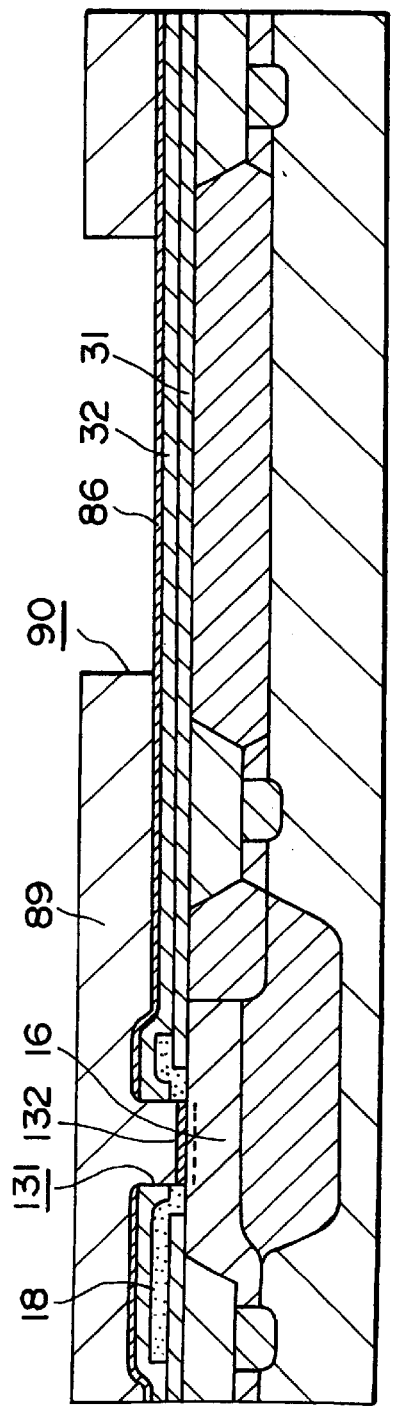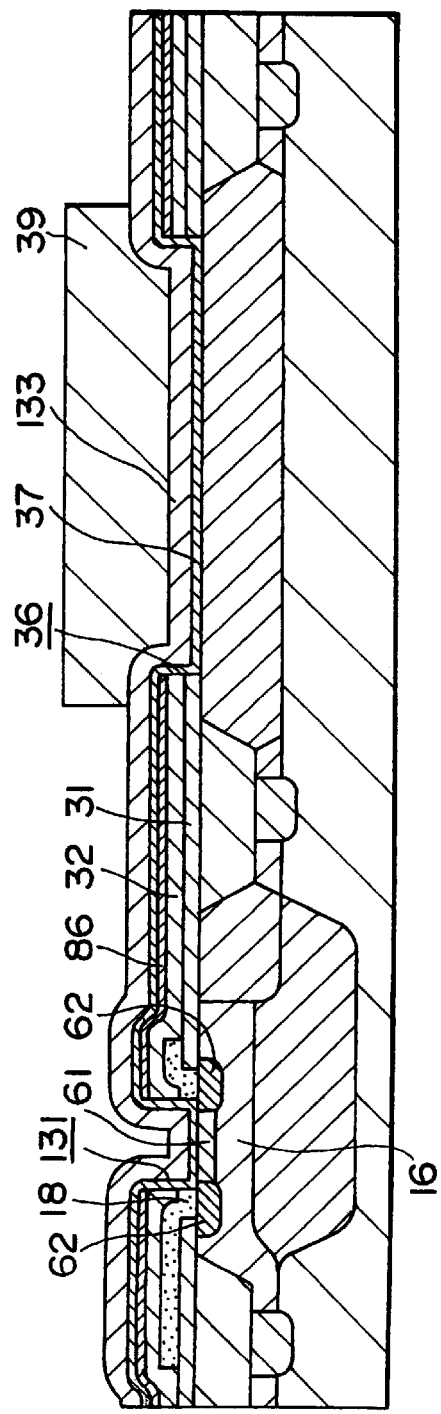

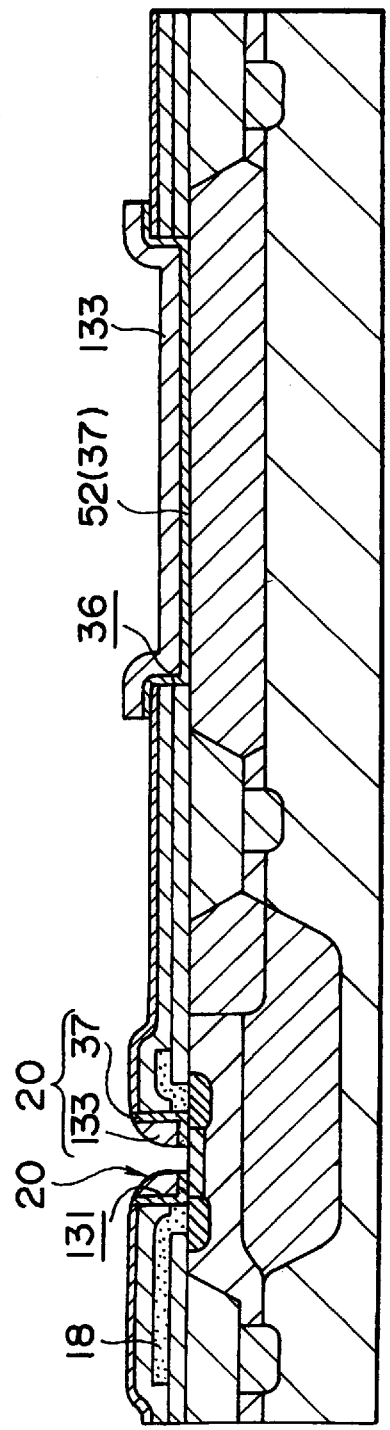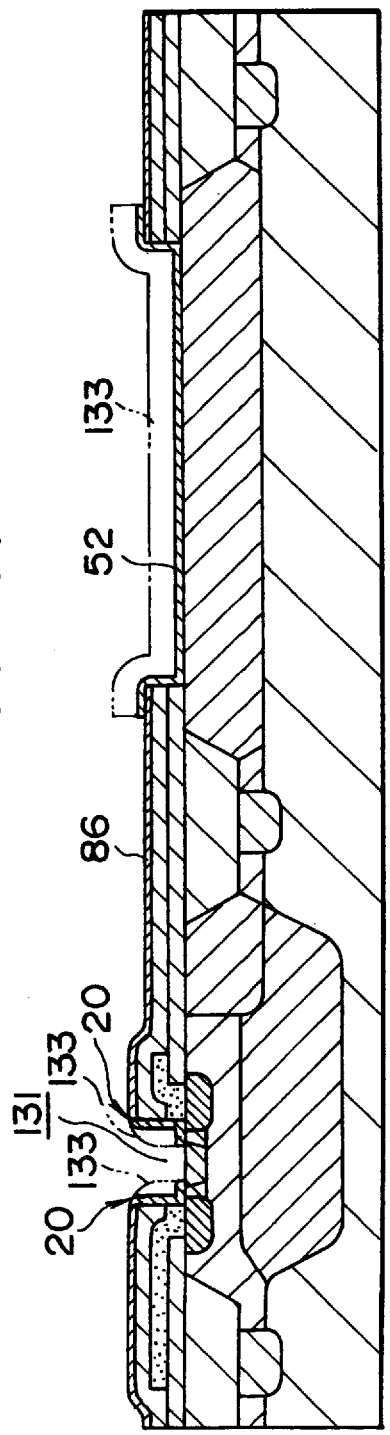

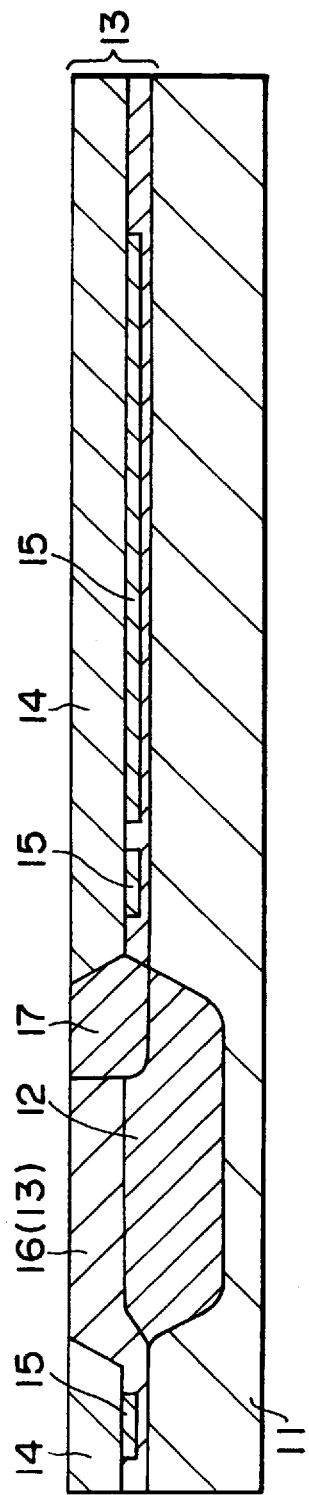
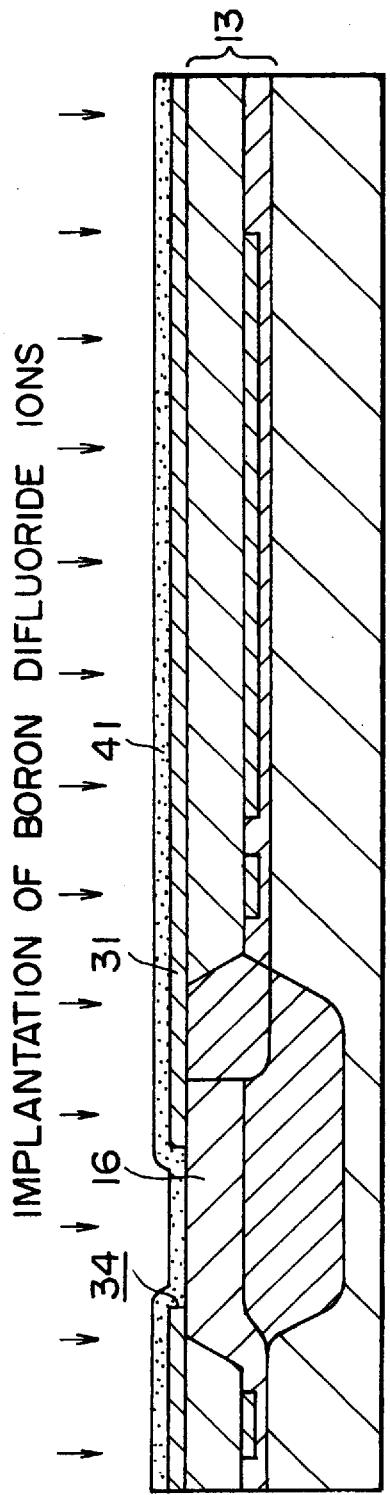

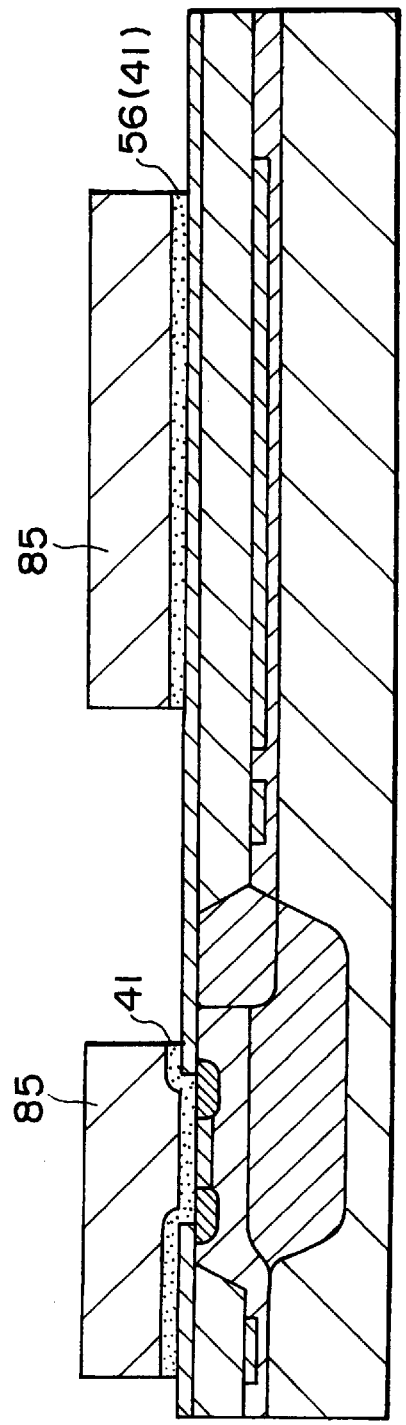
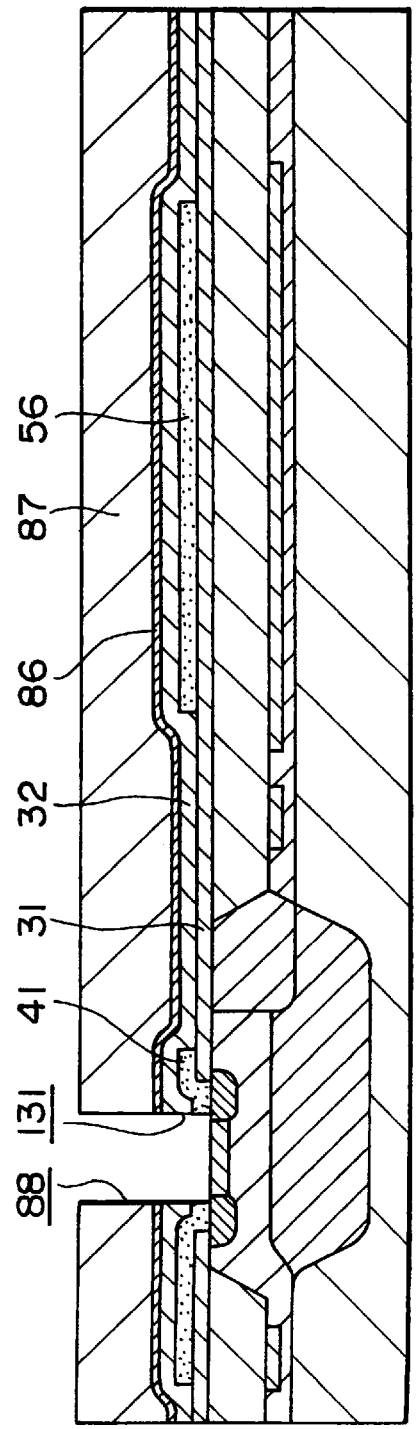

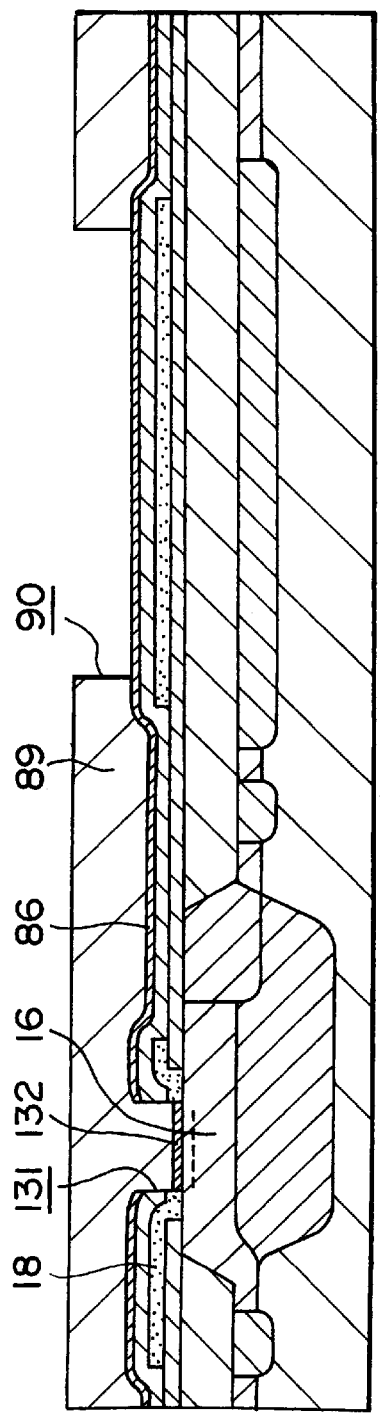
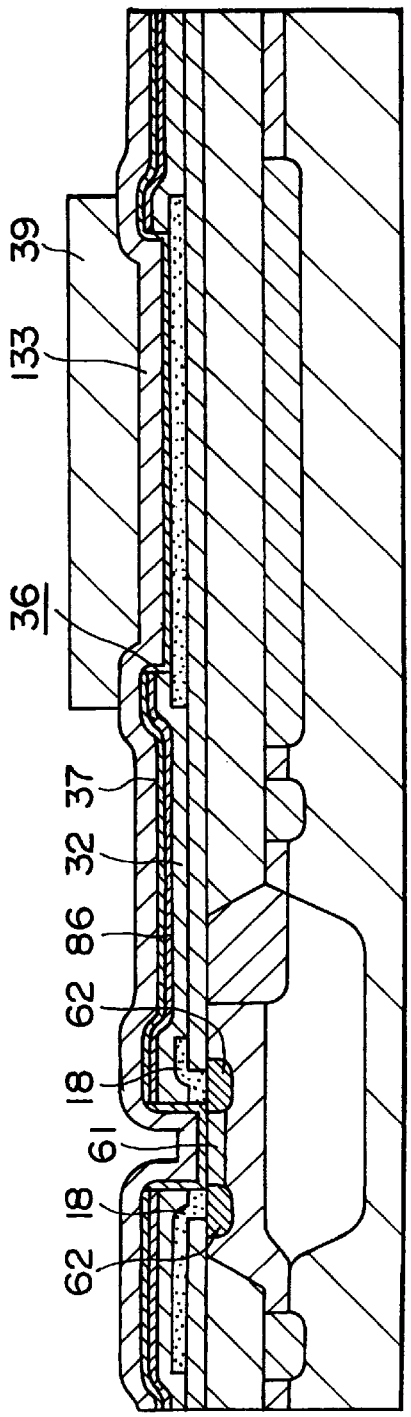

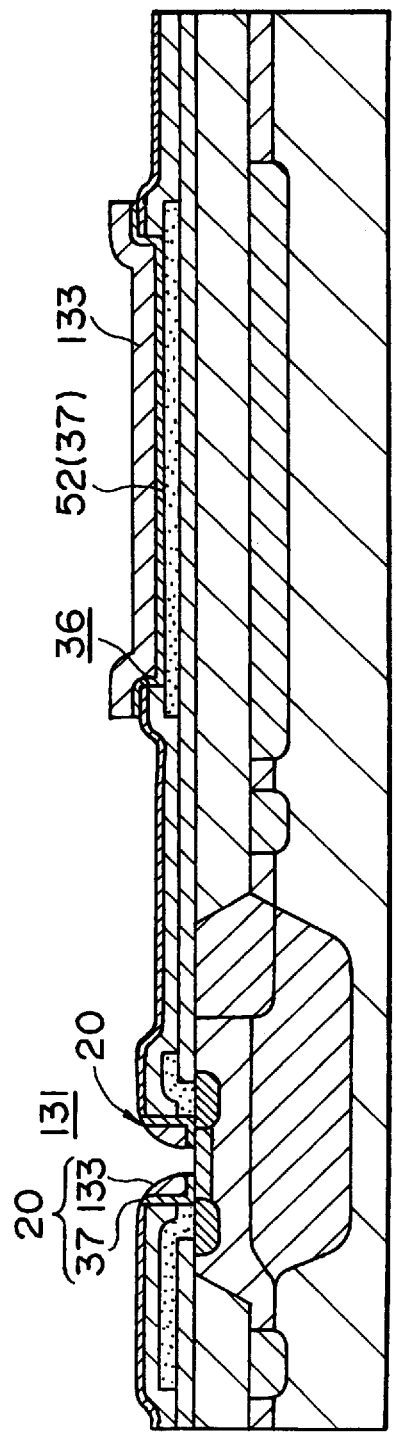

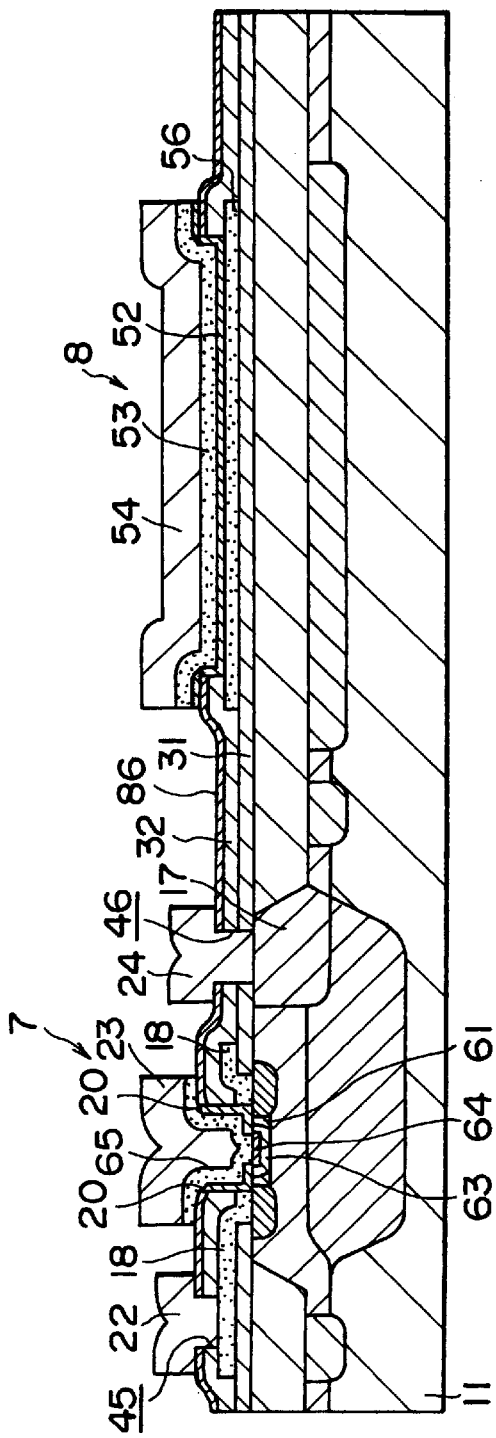
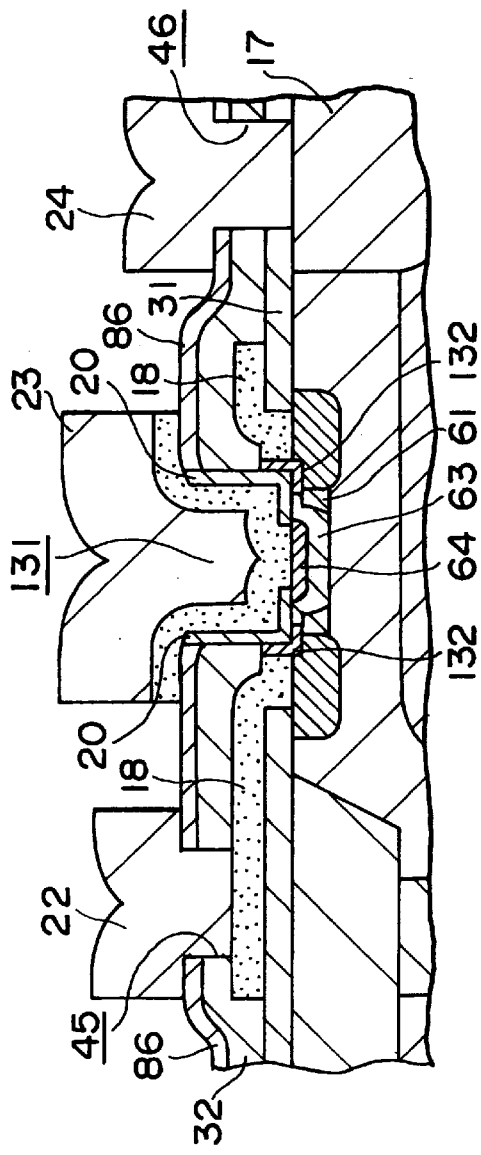

PROCESS OF FABRICATING INTEGRATED HETEROJUNCTION BIPOLAR DEVICE AND MIS CAPACITOR

BACKGROUND OF THE INVENTION

1. Field of the Invention

The present invention relates to a process of fabricating a semiconductor device.

2. Description of the Related Art

In order to meet a requirement for an increase in the maximum cut-off frequency (hereinafter, referred to as an "fTmax") of a bipolar transistor, there has been proposed a silicon series narrow base type heterojunction bipolar transistor including a base made of a material capable of making a more narrow band gap such as mixed crystals of silicon-germanium ($Si_{1-x}Ge_x$). And, it has been reported that the above bipolar transistor was successful in increasing the fTmax to a value of ftmax=100 GHz. Such a bipolar transistor is expected to be used in the telecommunications field which is a market of great promise with the advent of multi-media age.

In recent years, a silicon series narrow base type heterojunction bipolar transistor in which a silicon-germanium ($Si_{1-x}Ge_x$) thin film is formed by a selective growth process has been proposed, and put in practical use. Additionally, a known silicon series narrow base type heterojunction bipolar transistor will be described with reference to a schematic configuration thereof shown in FIG. 7.

In FIG. 7, an $N^+$-type buried layer 203 is formed in a semiconductor substrate 201 at a region isolated by portions of a field oxide film 202 positioned on both sides of the region. An $N^-$-type collector layer 204 is formed on the buried layer 203, and a silicon oxide film 207 provided with opening portions 205, 206 respectively positioned over the collector layer 204 and over part of the buried layer 203 is formed on the semiconductor substrate 201. An $N^+$-type collector electrode 208 is formed in the opening portion 206 in contact with the buried layer 203, and a P-type base layer 209 which is made of mixed crystals of silicon-germanium ($Si_{1-x}Ge_x$) and is formed on the collector layer 204 in the opening portion 205.

A base contact electrode 210 made of $P^+$-type polycrystalline silicon is connected to the base layer 209, and a silicon oxide layer 211 is formed on the base contact electrode 210. An opening portion 212 is formed in the base layer 210, and side walls 215 formed of both a silicon oxide film 213 and a silicon nitride film 214 are formed on side walls of the opening portion 212. An $N^+$-type emitter layer 216 is formed in the opening portion 212 via the side walls 215 in such a manner as to make a junction with the base layer 209. A process of fabricating the above silicon series narrow base type heterojunction bipolar transistor will be described with reference to FIGS. 8A to 8C.

FIGS. 8A to 8C show steps of fabricating emitter/base portions of a transistor. Parts corresponding to those described with reference to FIG. 7 are indicated by the same reference numerals.

At a step shown in FIG. 8A, an $N^-$-type collector layer 204 is formed on an $N^+$-type buried layer 203 formed in a semiconductor substrate (not shown), and a silicon oxide film 207, a base contact electrode layer 221, a silicon oxide film 211, and a silicon nitride layer 222 are sequentially formed in a state covering the $N^-$-type collector layer 204. Then, an opening portion 212 is formed in the silicon oxide film 222, the silicon oxide film 211 and the base contact electrode layer 221 at a portion over the collector layer 204, and side walls 223 made of a silicon nitride film are formed on side walls of the opening portion 212. After that, the silicon oxide film 207 is etched using the silicon nitride film 222 and the side walls 223 as an etching mask, to form an opening portion 205 having a diameter larger than that of the opening portion 212 for exposing the collector layer 204 on the bottom of the opening portion 205.

At a step shown in FIG. 8B, a P-type base layer 209 is formed in the opening portion 205 by selective epitaxial growth of mixed crystals of silicon-germanium ($Si_{1-x}Ge_x$), and the silicon nitride film 222 and the side walls 223 made of the silicon nitride film are removed.

At a step shown in FIG. 8C, side walls 215 made of a silicon oxide film 213 and a silicon nitride film 214 are formed on side walls of the opening portion 212 positioned over the base layer 209, and an emitter layer 216 made of $N^+$-type polycrystalline silicon is formed in the opening portion 212 via the side walls 215.

In this way, in the process of fabricating the silicon series narrow base type heterojunction bipolar transistor using selective growth, silicon nitride films are frequently used.

The above high speed bipolar transistor mainly adopts a so-called double polysilicon emitter/base self-aligned structure in which each of an emitter electrode and a base electrode is formed of a polycrystalline silicon thin film. The self-aligned technology has benefits in shortening an emitter-base distance, reducing a parasitic transistor portion, and realizing an emitter length less than the exposure limit by use of the side wall formed of an insulating film. For example, Japanese Patent Publication No. Hei 6-66325 (B) employs a heterojunction bipolar transistor having the above double polysilicon emitter/base self-aligned structure in which the base layer is formed of a thin film of silicon-germanium ($Si_{1-x}Ge_x$). In the bipolar transistor disclosed in this document, a number of silicon nitride films are used.

In the case of fabricating an IC using the above-described narrow base type heterojunction bipolar transistor, passive elements such as a resistor, a capacitor and an inductor are required to be provided in addition to the bipolar transistor. However, there has not been disclosed any structure in which these passive elements such as a resistor, capacitor and inductor are formed on one substrate together with a narrow base type heterojunction bipolar transistor using a base layer made of mixed crystals of silicon-germanium and a fabrication process thereof. In the case of forming a MIS capacitor on one substrate together with a narrow base type heterojunction bipolar transistor, the MIS capacitor is required to be formed by a process different from a fabrication process for the bipolar transistor.

SUMMARY OF THE INVENTION

The present invention has been made to solve the above-described problem, and an object of the present invention is to provide a process of fabricating a semiconductor device in which a bipolar transistor and a MIS capacitor are formed on the same substrate.

According to the present invention, there is provided a process of fabricating a semiconductor device, including the steps of: forming a base layer of a bipolar transistor on a semiconductor substrate by selective epitaxial growth; and forming a dielectric film of a MIS capacitor on the semiconductor substrate; wherein when side walls for isolating a base electrode connected to the base layer from an emitter layer formed on the base layer are formed, the dielectric film is formed of a film which is the same as one of films constituting the side walls.

In the above fabrication process, an upper electrode of the MIS capacitor may be formed of a film which the same as a film constituting the emitter layer, and a lower electrode of the MIS capacitor may be formed of a film which is the same as a film constituting the base electrode.

In the process of fabricating a semiconductor device having the above configuration, when the side walls for isolating the base electrode from the emitter layer are formed, the dielectric film of the MIS capacitor is formed of a film which is the same as one of films constituting the side walls, so that the dielectric film of the capacitor is not required to be formed by a different step as in the related art process.

In the above fabrication process, since the upper electrode of the MIS capacitor is formed of a film which is the same as a film constituting the emitter layer, the upper electrode of the capacitor is not required to be formed by a different step; and since the lower electrode of the MIS capacitor is formed of a film which is the same as a film constituting the base electrode, the lower electrode of the capacitor is not required to be formed by a different step.

BRIEF DESCRIPTION OF THE DRAWINGS

FIGS. 1A to 1C are diagrams showing essential steps of fabricating a semiconductor device according to a first embodiment of the present invention.

FIGS. 3A to 3G are diagrams showing steps of fabricating a semiconductor device according to a comparative example.

FIGS. 4A to 4H are diagrams showing steps of fabricating a semiconductor device according to a second embodiment.

FIGS. 6A to 6I are diagrams showing steps of fabricating a semiconductor device according to a fourth embodiment.

DESCRIPTION OF THE PREFERRED EMBODIMENTS

Figure 2I:
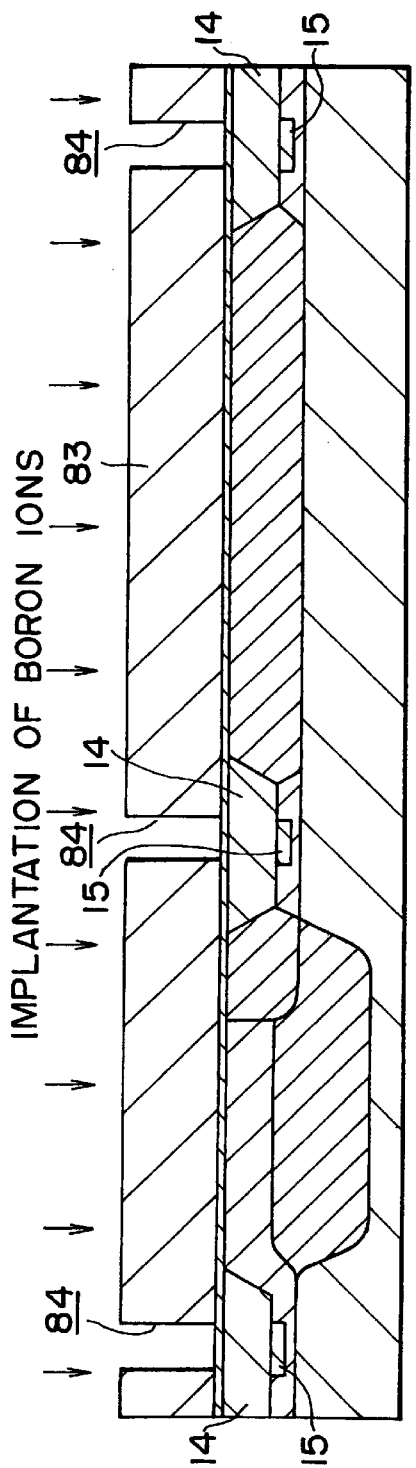
FIGS. 2A to 2T are diagrams showing detail steps of fabricating a semiconductor device according to the first embodiment.

A first embodiment of the present invention will be described with reference to FIGS. 1A to 1C. FIGS. 1A to 1C show essential fabrication steps of typically forming a MIS (Metal Insulator Semiconductor) capacitor basically in accordance with fabrication steps for a narrow base type heterojunction bipolar transistor.

At a step shown in FIG. 1A, an $N^+$-type buried layer 12 is formed in a silicon substrate 11 at a region where a bipolar transistor is to be formed and an N-type epitaxial layer 13 (hereinafter, referred to as an "epitaxial layer 13") is formed on the silicon substrate 11, to form a semiconductor base body 10. The epitaxial layer 13 is an N-type collector layer 16 at the region where the bipolar transistor is to be formed. Each isolation oxide film 14 is formed in the epitaxial layer 13 for isolating the region where the bipolar transistor is to be formed from a region where a MIS capacitor is to be formed, and a $P^+$-type isolation diffusion layer 15 is formed under each element isolating oxide film 14. An $N^+$-type plug diffusion layer 17 is formed in the epitaxial layer 13 in the region where the bipolar transistor is to be formed, and at the same time an $N^+$-type diffusion layer 51 for a lower electrode of the MIS capacitor is formed in the epitaxial layer 13 at the region where the capacitor is to be formed. A first silicon oxide film 31 is then formed on the semiconductor base body 10.

A base electrode 18 is formed on the first silicon oxide film 31 at the region where the bipolar transistor is to be formed. A second silicon oxide film 32 covering the base electrode 18 is formed on the first silicon oxide film 31. Next, an emitter opening portion 33 is formed in both the second silicon oxide film 32 and the base electrode 18 over the N-type collector layer 16, and a base opening portion 34 having a diameter larger than that of the emitter opening portion 33 in contact with the N-type collector layer 16 is formed in the first silicon oxide film 31 under the emitter opening portion 33. A P-type base layer 19 making a junction with the N-type collector layer 16 is formed in the base opening portion 34 by selective epitaxial growth of mixed crystals of, for example, P-type silicon-germanium ($Si_{1-x}Ge_x$).

A third silicon oxide film 35 for forming side walls is formed on both an inner wall of the emitter opening portion 33 and the second silicon oxide film 32. The third, second, and first silicon oxide films 35, 32, 31 on the silicon substrate 11 at the region where the capacitor is to be formed, are removed by lithography and etching, to form a capacitor opening portion 36. Next, both a silicon nitride film 37 and a polycrystalline silicon film 38 for forming side walls are sequentially formed on inner walls of the emitter opening portion 33 and the capacitor opening portion 36 and also on the third silicon oxide film 35.

A photoresist pattern 39 is formed by lithography in a state covering the polycrystalline film 38 at the region where the capacitor is to be formed, that is, the capacitor opening portion 36. The polycrystalline silicon film 38, silicon nitride film 37, and third silicon oxide film 35 are then anisotropically etched using the photoresist mask 39 as an etching mask.

Consequently, as shown in FIG. 1 B, side walls 20 comprised of the third silicon oxide film 35, silicon nitride film 37, and polycrystalline silicon film 38 are formed on side walls of the emitter opening portion 33, and a capacitor dielectric film 52 comprised of the silicon nitride film 37 is formed in the capacitor opening portion 36 with the polycrystalline silicon film 38 thus patterned remaining on the dielectric film 52. The side walls 20 isolate the base electrode 18 connected to the base layer 19 from an emitter layer which will be formed on the base layer 19 in the subsequent step. The photoresist pattern 39 is then removed. In addition, FIG. 1 B shows a state when the photoresist pattern 39 is removed.

At a step shown in FIG. 1C, an emitter layer 21 comprised of an $N^+$-type polycrystalline silicon film is formed in the emitter opening portion 33 over the base layer 19, and an upper electrode 53 comprised of the same $N^+$-type polycrystalline silicon film constituting the emitter layer 21 is formed on the polycrystalline silicon film 38 patterned at the region where the capacitor is to be formed.

In this way, the N-type collector layer 16, P-type base layer 19, and $N^+$-type emitter layer 21, which constitute the narrow base type heterojunction NPN bipolar transistor, and the $N^+$-type diffusion layer 51 as a lower electrode, dielectric film 52, and upper electrode 53, which constitute the MIS capacitor 2, are formed on the same silicon substrate 11.

According to the above process of fabricating the semiconductor device, since when the side walls 20 for isolating the base electrode 18 from the emitter layer 21 are formed, the dielectric film 52 of the MIS capacitor 2 is formed of the silicon nitride film 37 which is the same as one of the films constituting the side walls 20, the dielectric film of the MIS capacitor is not required to be formed by a different step. Since the upper electrode 53 of the MIS capacitor 2 is formed of the film which is the same as the film constituting the emitter layer 21, the upper electrode of the MIS capacitor is not required to be formed by a different step.

Accordingly, in the above fabrication process, the MIS capacitor 2 and the narrow base type heterojunction NPN bipolar transistor 1 are formed on the same silicon substrate 11 only by adding, to the steps of forming the NPN bipolar transistor 1, one lithography step and one etching step, as essential steps, for forming the capacitor opening portion 36, and one lithography step for forming the dielectric film 52 by patterning the silicon nitride film 37.

Next, details of the first embodiment will be described with reference to fabrication steps shown in FIG. 2A to 2T. These figures illustrate one example in which an NPN bipolar transistor and a MIS capacitor are formed on the same substrate. Parts corresponding to those described with reference to FIGS. 1A to 1 C are indicated by the same reference numerals. In addition, numbers put in parentheses of these figures follow serially.

At a step shown in FIG. 2A, a silicon oxide film 71 is formed on a P-type <100> silicon substrate (hereinafter, referred to as a "silicon substrate") 11 by thermal oxidation to a thickness of, for example, about 300 nm. A photoresist film (not shown) having an opening at a region where an N$^+$-type buried layer of a bipolar transistor is to be formed, is formed on the silicon oxide film 71 by lithography, and the silicon oxide film 71 is etched to have a window 72 using the photoresist film as an etching mask. The photoresist film is then removed, followed by vapor-phase diffusion of antimony at a diffusion temperature of about 1200 using the silicon oxide film 71 as a mask. In the above vapor-phase diffusion, antimony oxide (Sb$_2$O$_3$) is used as a solid diffusion source, As a result, an N$^+$-type buried layer 12 is formed in the silicon substrate 11. With respect to the N$^+$-type buried layer 12, a sheet resistance s is set at a value of, for example, 20 Ω/□ to 50 Ω/□ and a diffused depth Xj is set at a value of, for example, about 1 μm to 2 μm.

The silicon oxide film 71 is then removed by etching. At the next step shown in FIG. 2B, an N-type epitaxial layer 13 (hereinafter, referred to as an "epitaxial layer 13") having a resistivity of, for example, 0.3 Ω cm to 5 Ω cm is formed over the entire surface of the silicon substrate 11 to a thickness of about 0.7 μm to 2 μm by an epitaxial growth process. A semiconductor base body 10 is thus formed.

It is to be noted that the N$^+$-type buried layer 12 is also diffused to a lower portion of the epitaxial layer 13 upon the above expitaxial growth.

The process goes on to a step shown in FIG. 2C, in which a silicon oxide film 73 which will be taken as a buffer layer for local oxidation [for example, LOCOS (Local Oxidation of Silicon)] is formed on the epitaxial layer 13 to a thickness of, for example, about 20 nm to 50 nm. A silicon nitride film 74 which will be taken as a mask for LOCOS is formed on the silicon oxide film 73 to a thickness of, for example, 50 nm to 100 nm by chemical vapor deposition under low pressure (hereinafter, referred to as "LP-CVD"). The thickness of each of the silicon oxide film 73 and the silicon nitride film 74 is determined depending on the length of each bird beak caused by LOCOS, stress caused by LOCOS, and controllability for generation of defects.

At the next step shown in FIG. 2D, a photoresist film 75 having a window 76 at a region where an isolation oxide film is to be formed by LOCOS, is formed on the silicon nitride film 74 by lithography, and the silicon nitride film 74, silicon oxide film 73 and epitaxial layer 13 are etched using the photoresist film 75 as an etching mask. The etched amount of the epitaxial layer 13 is desired to be about one-half the thickness of the isolation oxide film to be formed in order that surface portions of the epitaxial layer 13 and the isolation oxide film are planarized after formation of the isolation oxide film by LOCOS. Accordingly, the photoresist film 75 is formed at a region where the bipolar transistor is to be formed and at a region where the MIS capacitor is to be formed.

The photoresist film 75 is then removed. The process goes on to a step shown in FIG. 2E, in which an isolation oxide film 14 is formed on the epitaxial layer 13 by steam oxidation (for LOCOS formation) at a temperature of 1000° C. to 1050° C. for 2 hrs to 6 hrs. The thickness of the isolation oxide film 14 is set to be about twice the etched depth of the epitaxial layer 13 within a range of, for example, 0.4 μm to 1.5 μm. Then, the silicon nitride film 74 is removed by wet-etching using hot phosphoric acid.

At the next step shown in FIG. 2F, a photoresist film 77 having windows 78, 79 respectively positioned at a region where an N$^+$-type plug diffusion layer is to be formed and at a region where the MIS capacitor is to be formed, is formed by lithography, followed by ion implantation of phosphorus ions (P$^+$) using the photoresist mask 77 as an ion implantation mask, to form an N$^+$-type plug diffusion layer which will be taken as a collector contact region of the NPN bipolar transistor and an N$^+$-type diffusion layer which will be taken as a lower electrode of the MIS capacitor. The ion implantation is performed at an acceleration energy of 40 keV to 100 keV in a dose of $1 \times 10^{15}$ ions/cm$^2$ to $1 \times 10^{16}$ ions/cm$^2$.

The photoresist film 77 is then removed. The process goes on to a step shown in FIG. 2G, in which a silicon oxide film 80 for planarization is formed by CVD to a thickness of, for example, about 100 nm to 600 nm, followed by annealing at a temperature of 900° C. to 1000° C. for about 30 min, to form an N$^+$-type plug diffusion layer 17 which will be taken as a collector contact region of the NPN transistor and an N$^+$-type diffusion layer 51 which will be taken as a lower electrode portion of the MIS capacitor. A photoresist film 81 is formed by coating a photoresist on the silicon oxide film 80 for planarization of bird heads caused by LOCOS. The photoresist film 81 and the silicon oxide film 80 are etched-back by general reactive ion etching (hereinafter, referred to as "RIE"), thus performing surface planarization.

At the next step shown in FIG. 2H, a silicon oxide film 82 is formed on the surface of the epitaxial layer 13 to a thickness of about 10 nm to 30 nm by oxidation at 900° C.

The process goes on to a step shown in FIG. 2I, in which a photoresist film 83 having a window 84 at a region where an isolation diffusion layer is to be formed, is formed by lithography, followed by ion implantation of boron ions (B$^+$) using the photoresist film 83 as an ion implantation mask, to form a P$^+$-type isolation diffusion layer 15 in the epitaxial layer 13 at a portion under the isolation oxide film 14. The ion implantation is performed at an acceleration energy of 200 keV to 500 keV in a dose of $1 \times 10^{13}$ ions/cm$^2$ to $1 \times 10^{14}$ ions/cm$^2$.

Figure 2J:
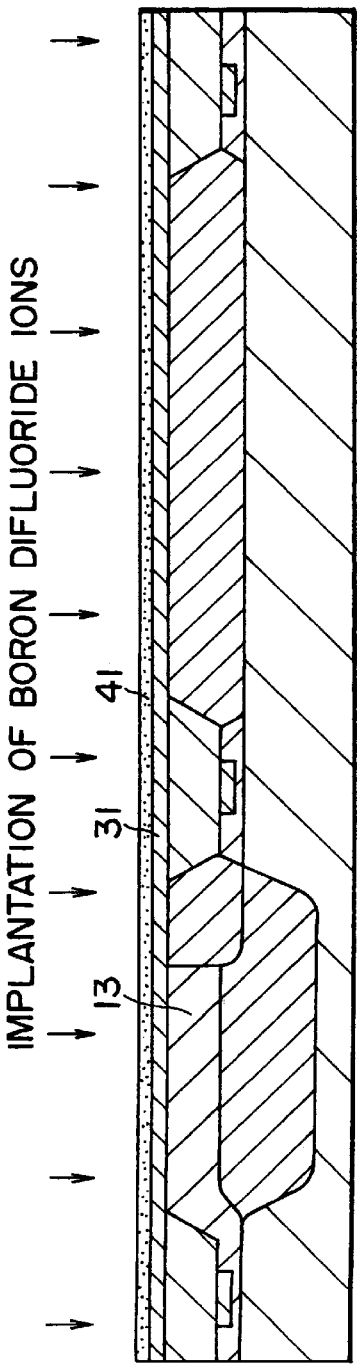

The photoresist film 83 is then removed. At the next step shown in FIG. 2J, a first silicon oxide film 31 is formed over the entire surface of the epitaxial layer 13 to a thickness of, for example, 50 nm to 300 nm by CVD, and a polycrystalline silicon film 41 is formed on the first silicon oxide film 31 to a thickness of, for example, 200 nm to 300 nm by CVD. Then, the polycrystalline silicon film 41 is entirely doped with boron difluoride ions ($BF_2^+$) by ion implantation. The ion implantation is performed at an acceleration energy of 20 keV to 100 keV and a dose of $1\times10^{14}$ ions/cm$^2$ to $1\times10^{16}$ ions/cm$^2$.

The process goes on to a step shown in FIG. 2K, in which a photoresist film 85 covering a region necessary for formation of a base electrode is formed by lithography, and the polycrystalline silicon film 41 is patterned using the photoresist film 85 as an etching mask by RIE, to be left at the region necessary for formation of the base electrode.

The photoresist film 85 is then removed. At the next step shown in FIG. 2L, a second silicon oxide film 32 is formed by CVD on the first silicon oxide film 31 to cover the polycrystalline silicon film 41 thus patterned, and a silicon nitride film 86 is formed on the second silicon oxide film 32 by CVD. A photoresist film 87 having a window 88 at the region where a base region (intrinsic base region) is to be formed, is formed on the silicon nitride film 86 by lithography.

Figure 2M:
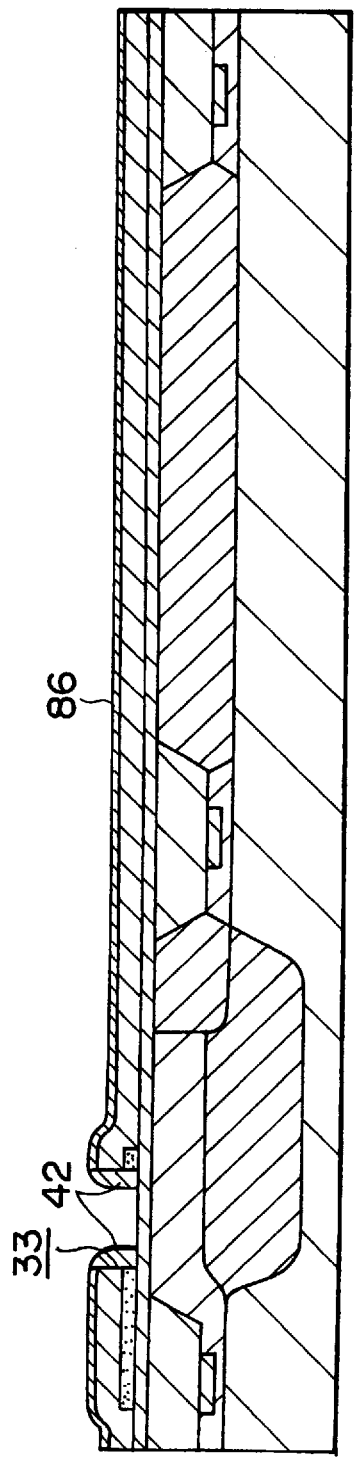

The process goes on to a step shown in FIG. 2M, in which the silicon nitride film 86, second silicon oxide film 32, and polycrystalline silicon film 41 are etched using the photoresist film 87 as a mask, to form an emitter opening portion 33. The photoresist film 87 is then removed. A silicon nitride film is formed by CVD, followed by etching-back thereof, to form side walls 42 made of silicon nitride on side walls of the emitter opening portion 33. The whole of the emitter opening portion 33 excluding a bottom portion is covered with the silicon nitride film 86 and the side walls 42 made of silicon nitride.

Figure 2N:
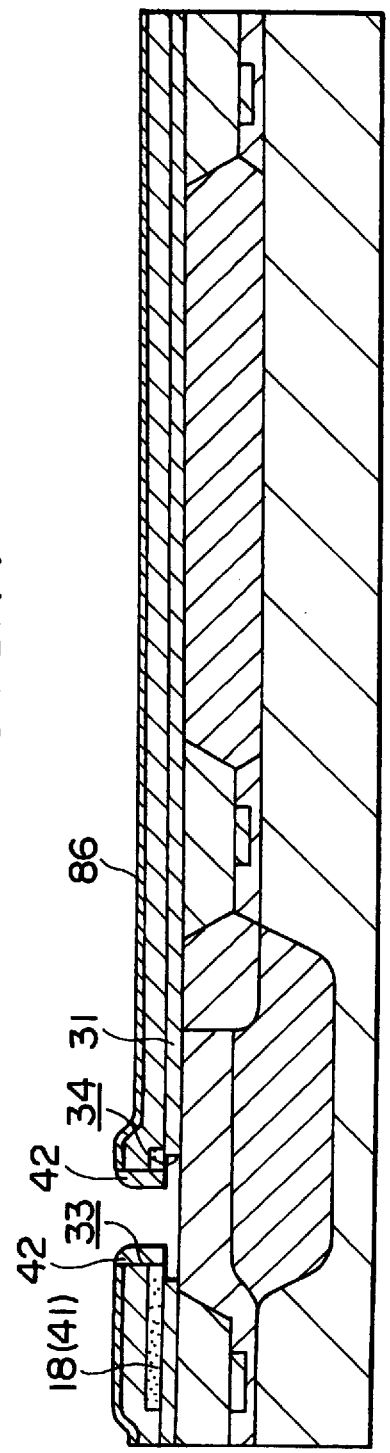

At the next step shown in FIG. 2N, the first silicon oxide film 31 is etched by hydrofluoric acid using the silicon nitride film 86 and the side walls 42 made of silicon nitride as a mask. At this time, the first silicon oxide film 31 is side-etched by over-etching thereof, to form a base opening portion 34 having a diameter larger than that of the emitter opening portion 33. In this etching, the polycrystalline silicon film 41 is also used as an etching mask. A base electrode 18 comprised of the polycrystalline silicon film 41 is thus formed by the above etching.

The process goes on to a step shown in FIG. 2O, in which the surface is cleaned by washing and a base layer 19 made of mixed crystals of P-type silicon-germanium ($Si_{1-x}Ge_x$, preferably $0.05 \leq x \leq 0.3$, for example x=0.15) is formed on the N-type epitaxial layer 16 through the base opening portion 34 by a selective epitaxial process such as UHV-CVD or LP-CVD. In the selective epitaxial process, $GeH_4$, $Si_2H_6$ or $SiH_2Cl_2$ gases as source gases are used to form the $Si_{1-x}Ge_x$ base layer 19. After that, the silicon nitride film 86 and the side walls 42 comprised of silicon nitride are removed by etching using hot phosphoric acid.

At the next step shown in FIG. 2P, a third silicon oxide film 35 is formed on the side walls of the emitter opening portion 33, on the base layer 19, and on the second silicon oxide film 32 to a thickness of, for example, 50 nm to 200 nm. A photoresist film 89 having a window 90 at a region where a MIS capacitor is to be formed, is formed by lithography.

The process goes on to a step shown in FIG. 2Q, in which the third, second, and first silicon oxide films 35, 32, 31 are etched using the photoresist film 89 as an etching mask, to form a capacitor opening portion 36 in the third, second, and first silicon oxide films 35, 32, 31. The photoresist film 89 is then removed.

A silicon nitride film 37 is formed to a thickness of, for example, 10 nm to 200 nm by CVD, and a polycrystalline silicon film 38 is formed to a thickness of, for example, 50 nm to 200 nm by CVD. The silicon nitride film 37 will be taken as not only side walls for isolating an emitter from a base of a bipolar transistor but also a dielectric film of the MIS capacitor.

The polycrystalline silicon film 38 may contain no impurity; however, it is doped with an N-type impurity as needed in situ upon the above CVD or by ion implantation of an N-type impurity after formation of the polycrystalline silicon film 38.

A photoresist pattern 39 covering the polycrystalline silicon film 39 at the region where the MIS capacitor is to be formed, that is, covering the capacitor opening portion 36, is formed by lithography. The polycrystalline silicon film 38, silicon nitride film 37, and third silicon oxide film 35 are anisotropically etched using the photoresist pattern 39 as an etching mask.

Consequently, as shown in FIG. 2R, side walls 20 comprised of the third silicon oxide film 35, silicon nitride film 37, and polycrystalline silicon film 38 are formed on side walls of the emitter opening portion 33, and a capacitor dielectric film 52 comprised of the silicon nitride film 37 is formed in the capacitor opening portion 36 with the patterned polycrystalline silicon film remaining on the dielectric film 52. The side walls 20 isolate the base electrode 18 connected to the base layer 19 from an emitter layer which will be formed on the base layer 19 in the subsequent step. The photoresist pattern 39 is then removed.

The process goes on to a step shown in FIG. 2S, in which a polycrystalline silicon film heavily doped with an N-type impurity which will be taken as both an emitter electrode of the NPN transistor and an upper electrode of the MIS capacitor, is formed by CVD, followed by emitter annealing at a temperature of 700° C. to 1000° C. In this annealing, not only the impurity in the emitter region is diffused but also the impurity in the polycrystalline silicon film at the region where the capacitor is to be formed is diffused to the polycrystalline silicon film 38 positioned thereunder. Then, a photoresist film (not shown) covering the region where the emitter electrode is to be formed and the region where the upper electrode of the MIS capacitor is to be formed is formed by lithography, and the polycrystalline silicon film is etched using the photoresist film as a mask, to form an emitter layer 21 and an upper electrode 53 each of which is made of the polycrystalline silicon film. The photoresist film (not shown) is then removed.

A photoresist film 91 having windows 92, 93 respectively positioned at regions where a base electrode and a collector electrode of the bipolar transistor are to be formed, is formed by lithography. While not shown, the photoresist film 91 has a window at a region where a lower electrode of the MIS capacitor is to be formed.

At the next step shown in FIG. 2T, the second and first silicon oxide films 32, 31 are etched using the photoresist film 91 as a mask, to form a base electrode opening portion 45 communicated to the base electrode 18 in the second silicon oxide film 32, and to form a collector electrode opening portion 46 communicated to the $N^+$-type plug diffusion layer 17 in the second and first silicon oxide films 32, 31. While not shown, a lower electrode opening portion communicated to the $N^+$-type diffusion layer 51 which will be taken as a lower electrode layer of the MIS capacitor, is formed. The photoresist film 91 is then removed.

A barrier metal film and an aluminum based metal film are formed by sputtering, and are patterned by well known lithography and etching. As a result, a base metal electrode 22 connected to the base electrode 18 is formed in the base electrode opening portion 45; an emitter metal electrode 23 is formed on the emitter layer 21; and a collector metal electrode 24 connected to the $N^+$-type plug diffusion layer 17 is formed in the collector electrode opening portion 46. An upper metal electrode 54 is also formed on the upper electrode 53 of the MIS capacitor. While not shown, a metal electrode connected to the $N^+$-type diffusion layer 51 which will be taken as the lower electrode layer of the MIS capacitor is formed in the lower electrode opening portion.

The photoresist film formed by lithography is then removed, followed by known steps of forming multi-layered interconnections (not shown). In this way, the narrow base type heterojunction NPN bipolar transistor 1 and the MIS capacitor 2 are formed on the same silicon substrate 11.

In the fabrication process described with reference to FIGS. 2A to 2T, the $N^+$-type diffusion layer 51 taken as the lower electrode is formed simultaneously with formation of the $N^+$-type plug diffusion layer 17 by the same ion implantation. Also the dielectric film 52 is formed of the silicon nitride film 37 which constitutes the side walls 20 of the NPN bipolar transistor 1, and the upper electrode 53 is formed of the same polycrystalline silicon film constituting the emitter layer 21.

Accordingly, the narrow base type heterojunction NPN bipolar transistor 1 having the base layer 19 made of mixed crystals of silicon-germanium and the MIS capacitor 2 can be formed on the same silicon substrate 11 only by adding, to the steps of fabricating the NPN bipolar transistor 1, the two lithography steps and one etching step, that is, the lithography and etching steps for forming the capacitor opening portion 36 and the lithography step for patterning the dielectric film 52. As a result, a high quality bipolar transistor LSI can be realized.

Here, a process of forming a MIS capacitor basically in accordance with a fabrication process for an NPN bipolar transistor of a double polysilicon structure with reference to FIG. 3A to 3G, in comparison with the first embodiment of the fabrication process of the present invention. In these figures, parts corresponding to those shown in FIG. 2A to 2T are indicated by the same reference numerals.

First, the steps described with reference to FIG. 2A to 2I will be repeated. Specifically, as shown in FIG. 3A, an $N^+$-type buried layer 12 is formed in a silicon substrate 11; an N-type epitaxial layer 13 is formed on the silicon substrate 11; an isolation oxide film 14 is formed in the epitaxial layer 13; and a $P^+$-type isolation diffusion layer 15 is formed in the epitaxial layer 13 at a portion under the isolation oxide film 14. Also, the epitaxial layer 13 at a region where a bipolar transistor is to be formed is taken as an N-type collector layer 16, and an $N^+$-type diffusion layer 51 is formed in the epitaxial layer 13 at a region where a capacitor is to be formed. The $N^+$-type diffusion layer 51 is formed simultaneously with formation of an $N^+$-type plug diffusion layer 17 in the epitaxial layer 13 at the region where the bipolar transistor is to be formed.

At the next step shown in FIG. 3B, a first silicon oxide film 31 is formed on the epitaxial layer 13, followed by patterning thereof by lithography and etching, to form a capacitor opening portion 36 therein at the region where a capacitor is to be formed. A silicon nitride film is formed on the first silicon oxide film 31 including the capacitor opening portion 36, followed by patterning thereof by lithography and etching, to form a dielectric film 52 of the MIS capacitor in the capacitor opening portion 36.

The process goes on to a step shown in FIG. 3C, in which the first silicon oxide film 31 at a portion on the N-type collector layer 16 is patterned by lithography and etching, to form a base opening portion 34 in the first silicon oxide film 31. The photoresist mask formed by lithography is removed. Then, a polycrystalline silicon film 111 covering the dielectric film 52 is formed in the base opening portion 34 and on the first silicon oxide film 31. The polycrystalline silicon film 111 is then entirely doped with a P-type impurity such as boron or boron difluoride by ion implantation.

At the next step shown in FIG. 3D, the polycrystalline silicon film 111 is patterned by lithography and etching, to form a polycrystalline silicon pattern 112 connected to the N-type collector layer 16 through the base opening portion 34, and an upper electrode 53 is formed on the dielectric film 52. The photoresist mask formed by lithography is then removed. A second silicon film 32 covering the polycrystalline silicon pattern 112 and the upper electrode 53 is formed by CVD.

The process goes on to a step shown in FIG. 3E, in which the second silicon oxide film 32 and the polycrystalline silicon pattern 112 are patterned by lithography and etching, to form an emitter opening portion 33 on the upper and inner side of the base opening portion 34 positioned over the N-type collector layer 16. Thus a base electrode 18 is formed of the polycrystalline silicon pattern 112. Then, ions of boron ($B^+$) or boron difluoride ($BF_2^+$) are implanted from the emitter opening portion 33.

At the next step shown in FIG. 3F, a silicon oxide film for side walls is formed on the second silicon oxide film 32 in such a manner as to be embedded in the emitter opening portion 33, followed by activation annealing, to form a base layer 113 and graft bases 114 connected to the base layer 113 and base electrode 18, followed by etching-back of the silicon oxide film for side walls, to form side walls 20 on side walls of the emitter opening portion 33.

Figure 3G:
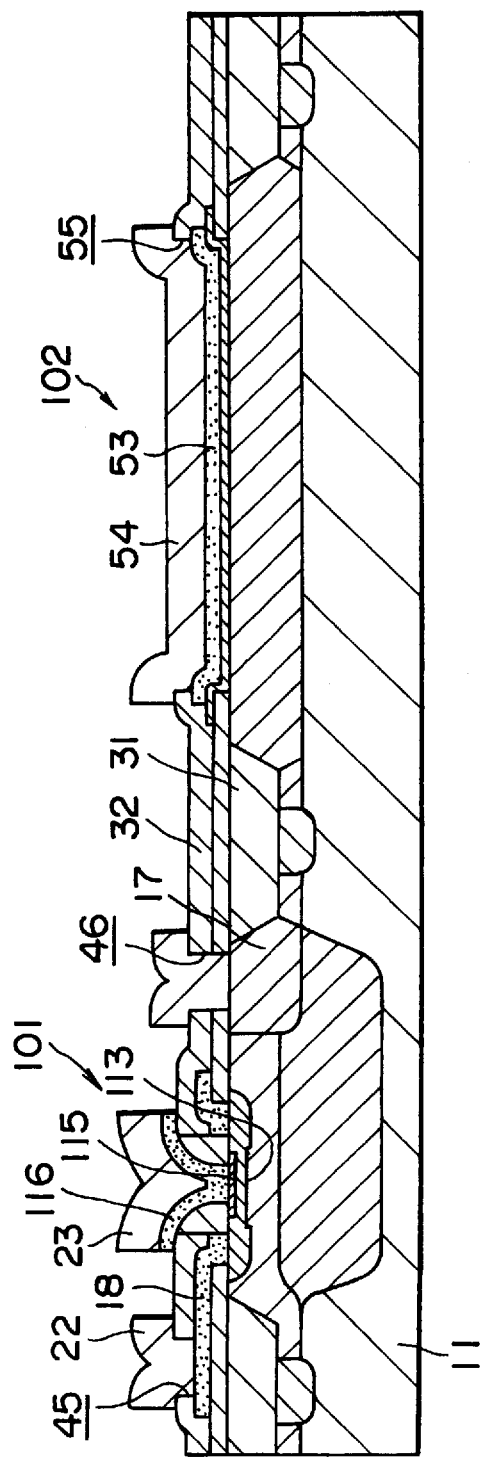

The process goes on to a step shown in FIG. 3G, in which a polycrystalline silicon film heavily doped with an N-type impurity which will be taken as an emitter electrode of the NPN transistor, is formed by CVD, followed by emitter annealing at a temperature of 700° C. to 1100° C., to diffuse the impurity in the polycrystalline silicon film to a surface layer of the base layer 113 positioned thereunder, whereby forming an emitter layer 115.

A photoresist film (not shown) covering a region where an emitter electrode is to be formed, is formed by lithography, and the polycrystalline silicon film is etched using the photoresist film as an etching mask, to form an emitter electrode 116 comprised of the polycrystalline silicon film. The photoresist film (not shown) is then removed.

The second and first silicon oxide films 32, 31 are patterned by lithography and etching, to form a base electrode opening portion 45 communicated to the base electrode 18 in the second silicon oxide film 32 and to form a collector electrode opening portion 46 communicated to the $N^+$-type plug diffusion layer 17 in the second and first silicon oxide films 32, 31. At the same time, an upper electrode opening portion 55 is formed at position over the upper electrode 53. The photoresist film (not shown) used as the etching mask is then removed.

A barrier metal film and an aluminum based metal film are formed by sputtering, and are patterned by known lithography and etching, to form a base metal electrode 22 connected to the base electrode 18 in the base electrode opening portion 45, an emitter metal electrode 23 on the emitter electrode 116, and a collector metal electrode 24 to the N+-type plug diffusion layer 17 in the collector electrode opening portion 46. At the same time, an upper metal electrode 54 connected to the upper electrode 53 of the MIS capacitor is formed in the upper electrode opening portion 55. The NPN bipolar transistor 101 and the MIS capacitor 102 are thus formed on the same silicon substrate 11.

In the above-described comparative fabrication process, it is required for forming the dielectric film 52 of the MIS capacitor 102 to add, to the steps of fabricating the bipolar transistor, the lithography and etching steps for forming the capacitor opening portion 36 in the first silicon oxide film 31, the step of forming the dielectric film 52, and the step of patterning the dielectric film 52. That is, the two lithography steps, one film formation step, and two etching steps are required to be added.

The fabrication process of the present invention described with reference to FIG. 2A to 2T is smaller in the number of the additional steps than the fabrication process of forming the MIS capacitor 102 on the same silicon substrate 11 using the steps of fabricating the bipolar transistor of the double polysilicon structure.

Accordingly, the fabrication process of the present invention can realize a high quality LSI, in which the high quality narrow base type heterojunction NPN bipolar transistor 1 having the base layer made of mixed crystals of silicon-germanium and the MIS capacitor 2 are formed on the same substrate 11, by adding the minimum number of steps to the steps of forming the NPN bipolar transistor 1. Next, a second embodiment of the present invention will be described with reference to fabrication steps shown in FIG. 4A to 4H.

In these figures, there is shown fabrication steps of forming a MIS capacitor basically in accordance with the steps for forming a narrow base type heterojunction bipolar transistor as in the first embodiment. In addition, the steps similar to those in the first embodiment will be briefly described, and therefore, the details of the steps should be referred to the description of the first embodiment.

The steps described with reference to FIGS. 2A to 2C will be repeated. Specifically, as shown in FIG. 4A, an N+-type buried layer 12 is formed in a silicon substrate 11 in a region where a bipolar transistor is to be formed. An N-type epitaxial layer 13 is formed over the entire surface of the silicon substrate 11 by an epitaxial growth process. A semiconductor base body 10 is thus formed. It is to be noted that the N+-type buried layer 12 is also diffused to a lower portion of the epitaxial layer 13 upon the above epitaxial growth. A silicon oxide film 73 which will be a buffer layer for LOCOS is formed, and a silicon nitride film 74 which will be a mask for LOCOS is formed by LP-CVD In the next step shown in FIG. 4B, a photoresist film 121 covering the region where the bipolar transistor is to be formed, is formed on the silicon nitride film 74 by lithography, and the silicon nitride film 74, silicon oxide film 73, and epitaxial layer 13 are etched using the photoresist mask 121 as an etching mask. The etched amount of the epitaxial layer 13 is desired to be about one-half the thickness of an isolation oxide film which will be formed by LOCOS in order that surface portions of the epitaxial layer 13 and the isolation oxide film are planarized after formation of the isolation oxide film.

The photoresist film 121 is then removed. The process goes on to a step shown in FIG. 4C, in which an isolation oxide film 14 is formed in the epitaxial layer 13 by steam oxidation at a temperature of 1000° C. to 1050° C. for 2 hrs to 6 hrs by LOCOS. The thickness of the isolation oxide film 14 is set to be about twice the etched depth of the epitaxial layer 13 within a range of, for example, 0.4 μm to 1.5 μm.

The silicon nitride film 74 is removed by wet-etching using hot phosphoric acid. Accordingly, the isolation oxide film 14 is also formed at a region in which a MIS capacitor is to be formed.

Figure 4C:
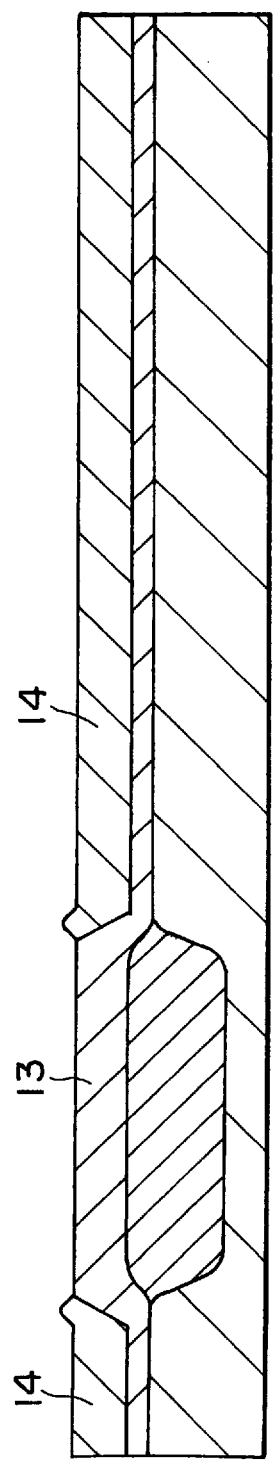
Figure 4D:
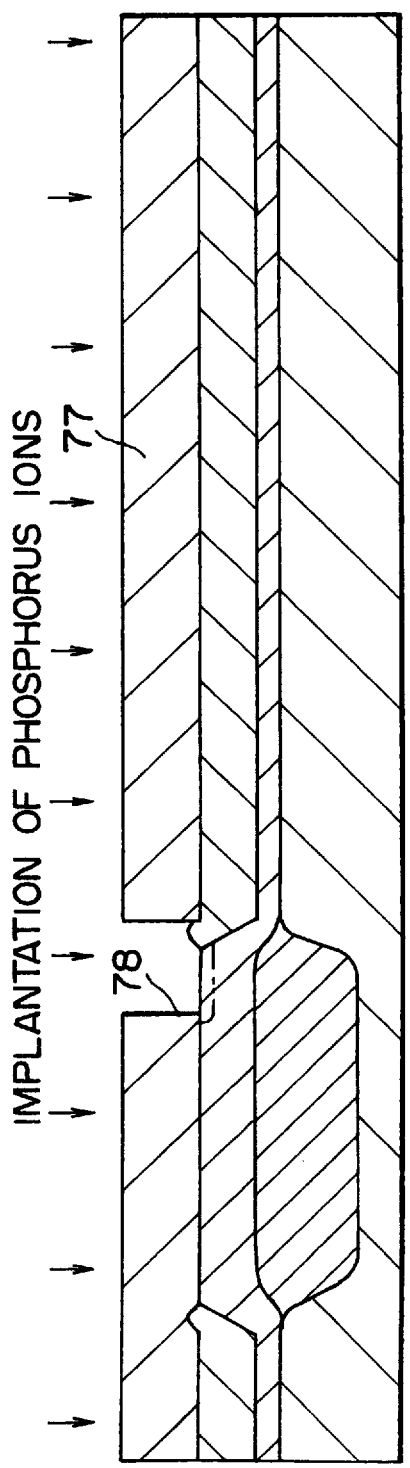

At the next step shown in FIG. 4D, a photoresist film 77 having a window 78 at a region in which an N+-type plug diffusion layer is to be formed, is formed by lithography, followed by ion implantation of phosphorus ions (P+) using the photoresist film 77 as an ion implantation mask for forming an N+-type plug diffusion layer which will be taken as a collector contact region of the NPN bipolar transistor. The ion implantation is performed in the same condition as that described with reference to FIG. 2F.

The photoresist film 77 is then removed. The steps described with reference to FIG. 2G to 2J will be repeated. Specifically, as shown in FIG. 4E, a silicon oxide film (not shown) for planarization is formed, followed by annealing, to form an N+-type plug diffusion layer 17 which will be taken as a collector contact region of the NPN bipolar transistor.

A photoresist (not shown) covering the silicon oxide film (not shown) is formed, followed by etching-back of the photoresist film and the silicon oxide film, to planarize bird heads caused by LOCOS. A silicon oxide film (not shown) is formed on the surface of the epitaxial layer 13 to a thickness of about 10 nm to 30 nm by oxidation at a temperature of 900. A P+-type isolation diffusion layer 15 is formed in the epitaxial layer 13 at a portion under the isolation oxide film 14 by selective ion implantation of a P-type impurity (for example, boron ions).

A first silicon oxide film 31 is formed over the entire surface of the epitaxial layer 13 to a thickness of, for example, 50 nm to 300 nm by CVD, and a polycrystalline silicon film 41 is formed on the first silicon oxide film 31 to a thickness of, for example, 200 nm to 300 nm by CVD. Then, the polycrystalline silicon film 41 is entirely doped with boron difluoride ions($BF_2^+$) by ion implantation. The ion implantation is performed at an acceleration energy of 20 keV to 100 keV in a dose of $1\times10^{14}$ ions/cm$^2$ to $1\times10^{16}$ ions/cm$^2$.

The process goes on to a step shown in FIG. 4F, in which a photoresist film 85 covering a region necessary for formation of a base electrode and a region where the MIS capacitor is to be formed, is formed by lithography. The polycrystalline silicon film 41 is patterned by RIE using the photoresist film 85 as an etching mask, to be left at the region necessary for formation of the base electrode and to be left as a lower electrode 56 at the region where the MIS capacitor is to be formed.

The photoresist film 85 is then removed. The process goes on to a step shown in FIG. 4G, in which a second silicon oxide film 32 is formed on the first silicon oxide film 31 in a state covering the patterned polycrystalline silicon film 41 and the lower electrode 56. Also, a silicon nitride film 86 is formed on the second silicon oxide film 32 by CVD. A photoresist film 87 having a window 88 at a region where a base region (intrinsic base region) is to be formed, is formed on the silicon nitride film 86 by CVD.

Next, the steps described with reference to FIG. 2M to 2T may be repeated. Thus, as shown in FIG. 4H, an emitter opening portion 33 is formed in the silicon nitride film, second silicon nitride film 32, and polycrystalline silicon film 41, and a base electrode 18 is formed of the polycrystalline silicon film 41. The photoresist film 87 is then removed. Then, side walls of silicon nitride (not shown) are formed on side walls of the emitter opening portion 33, and the first silicon oxide film 31 is etched by hydrofluoric acid using the side walls of silicon nitride and the silicon nitride film as a mask. The first silicon oxide film 31 is side-etched by over-etching thereof, to form a base opening portion 34 having a diameter larger than that of the emitter opening portion 33. In this etching, the polycrystalline silicon film 41 is used as a mask. A base electrode 18 is thus formed of the polycrystalline silicon film 41 by the above etching. A base layer 19 comprised of mixed crystals of P-type silicon-germanium($Si_{1-x}Ge_x$, preferably $0.05 \leq x \leq 0.3$, for example x=0.15) is formed on the N-type collector layer through the base opening portion 34. $GeH_4$, $Si_2H_6$ or $SiH_2Cl_2$ gases are used as source gases to form the $Si_{1-x}Ge_x$ base layer 19.

A third silicon oxide film 35 is formed on the side walls of the emitter opening portion 33, on the base layer 19, and on the second silicon oxide film 35, and a capacitor opening portion 36 is formed in the third and second silicon oxide films 35, 32 at a position over the lower electrode 56. Next, a silicon nitride film 37 and a polycrystalline silicon film 38 are sequentially formed. Side walls 20 comprised of the polycrystalline silicon film 38, silicon nitride film 37, and third silicon oxide film 35 are formed on side walls of the emitter opening portion 33, and a capacitor dielectric film 52 comprised of the silicon nitride film 37 is formed in the capacitor opening portion 36 with the patterned polycrystalline silicon film 38 remaining on the dielectric film 52.

An $N^+$-type emitter layer 21 comprised of a polycrystalline silicon film is formed in the emitter opening portion 33, and an upper electrode 53 comprised of the same polycrystalline silicon film constituting the emitter layer 21 is formed at the region in which the capacitor is to be formed. The second and first silicon oxide films 32, 31 are etched, to form a base electrode opening portion 45 communicated to the base electrode 18 in the second silicon oxide film 32 and to form a collector electrode opening portion 46 communicated to the $N^+$-type plug diffusion layer 17 in the second and first silicon oxide films 32, 31.

A barrier metal film and an aluminum based metal film are formed, followed by patterning thereof, to form a base metal electrode 22 connected to the base electrode 18 in the base electrode opening portion 45, an emitter metal electrode 23 on the emitter layer 21, and a collector metal electrode 24 connected to the $N^+$-type plug diffusion layer 17 in the collector electrode opening portion 46. Further, an upper metal electrode 54 is formed on the upper electrode 53 of the MIS capacitor. The narrow base type heterojunction NPN bipolar transistor 3 and the MIS capacitor 5 are thus formed on the same silicon substrate 11.

According to the second embodiment of the fabrication process, since when the side walls 20 for isolating the base electrode connected to the base layer 19 from the emitter layer 21 formed on the base layer 19 are formed, the dielectric film 52 is formed of the silicon nitride film 37 which is the same as one of the films constituting the side walls 20, the capacitor dielectric film is not required to be formed by a different step.

Further, according to the above fabrication process, since the lower electrode 56 of the MIS capacitor 4 is formed of the same polycrystalline silicon film 41 constituting the base electrode 18, the lower electrode of the capacitor is not required to be formed by a different step, and since the upper electrode 53 of the MIS capacitor is formed of the same polycrystalline silicon film constituting the emitter layer 21, the upper electrode of the capacitor is not required to be formed by a different step.

The MIS capacitor 4 can be thus formed on the silicon substrate 11 together with the narrow base type heterojunction NPN bipolar transistor 3 having the base layer 19 made of mixed crystals of silicon-germanium only by adding, to the steps of fabricating the NPN bipolar transistor, the two lithography steps and one etching step, that is, the lithography and etching steps for forming the capacitor opening portion 36 and the lithography step for patterning the dielectric film 52. Accordingly, a high quality LSI comprised of the NPN bipolar transistor 3 and the MIS capacitor 4 can be realized only by adding the minimum number of the steps to the steps of forming the NPN bipolar transistor 3.

Next, a third embodiment of the process of fabricating a semiconductor device according to the present invention will be described with reference to fabrication steps shown in FIG. 5A to FIG. 5L. In these figures, parts corresponding to those described with reference to FIG. 2A to FIG. 2T are indicated by the same reference numerals.

The same steps as those described with reference to FIG. 2A to FIG. 2I will be repeated. Thus, shown in FIG. 5A, an $N^+$-type buried layer 12 is formed in a silicon substrate 11 and an N-type epitaxial layer 13 is formed on the silicon substrate 11. An isolation oxide film 14 is formed in the epitaxial layer 13. The epitaxial layer 13 in a region where a bipolar transistor is to be formed is taken as an N-type collector layer 16. Next, by ion implantation, an $N^+$-type plug diffusion layer 17 connected to the $N^+$-type buried layer 12 is formed in the epitaxial layer 13 in the region where the bipolar transistor is to be formed, and an $N^+$-type diffusion layer 51 is formed in the epitaxial layer 13 in a region where a MIS capacitor is to be formed. Moreover, a $P^+$-type isolation oxide diffusion layer 15 is formed under the isolation oxide film 14 by ion implantation. While not shown, the silicon oxide film 82 described with reference to FIG. 2H is formed on the surface of the epitaxial layer 13.

At the next step shown in FIG. 5B, a first silicon oxide film 31 is formed on the expitaxial layer 13 to a thickness of, for example, 50 nm to 300 nm. A base opening portion 34 is formed in the first silicon oxide film 31 on the N-type collector layer 16 by lithography and etching (for example, RIE). The resist film formed by lithography is then removed. A polycrystalline silicon film 41 is formed by CVD on the inner surface of the base opening portion 34 and on the first silicon oxide film 31 to a thickness of 100 nm to 300 nm. Then, the polycrystalline silicon film 41 is entirely doped with boron difluoride ions ($BF_2^+$) by ion implantation. The ion implantation is performed at an acceleration energy of 20 keV to 100 keV and a dose of $1 \times 10^{14}$ ions/cm$^2$ to $1 \times 10^{16}$ ions/cm$^2$.

Figure 5C:
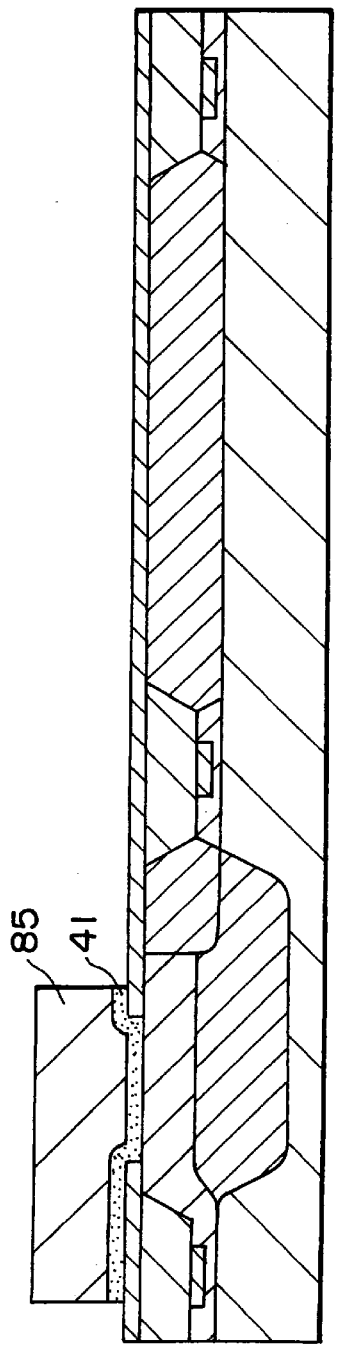
FIGS. 5A to 5N are diagrams showing steps of fabricating a semiconductor device according to a third embodiment.

The process goes on to a step shown in FIG. 5C at which a resist film 85 is formed by lithography on a region where a base electrode is to be formed. The polycrystalline silicon film 41 is patterned by RIE using the resist film 85 as an etching mask, to leave the polycrystalline silicon film 41 on the region where the base electrode is to be formed.

Figure 5D:
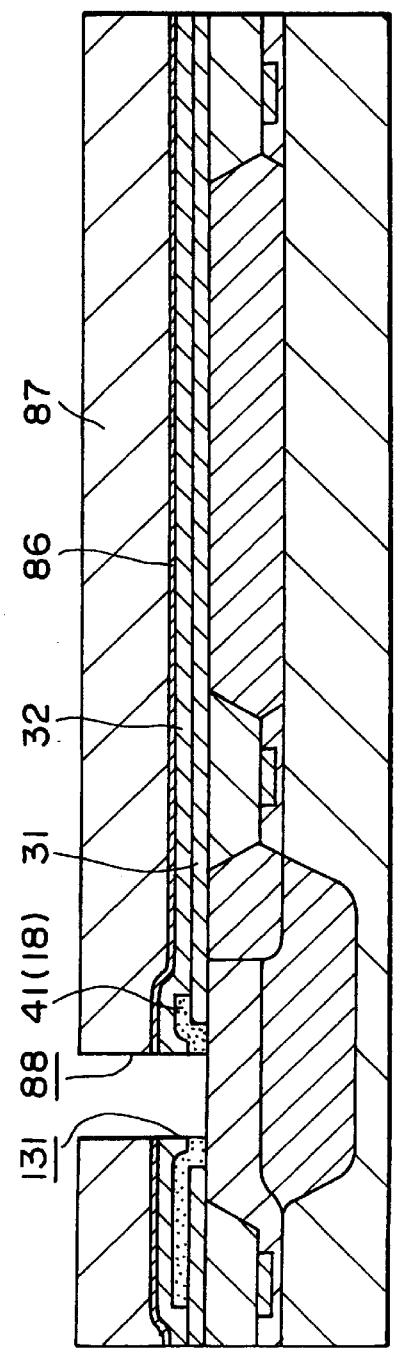

At the next step shown in FIG. 5D, a second silicon oxide film 32 is formed by CVD on the first silicon oxide film 31 in such a manner as to cover the patterned polycrystalline silicon film 41. Then, a silicon nitride film 86 is formed on the second silicon oxide film 32 by CVD. A resist film 87 is formed on the silicon nitride film 86 by lithography such that a window 88 is formed in the resist 87 on an area where base region (intrinsic base region) is to be formed. The silicon nitride film 86, second silicon oxide film 32, and polycrystalline silicon film 41 are subjected to etching (for example, RIE) using the resist film 87 as a mask, to form an opening portion 131. Hereinafter, the polycrystalline silicon film 41 is referred to as a base electrode 18.

Then, the resist film 87 is removed. The process goes on to a step shown in FIG. 5E at which a thin oxide film 132 is formed by oxidation on the N-type collector layer 16 on the bottom portion of the opening portion 131 to a thickness of 10 nm to 30 nm. At this time, while not shown, the exposed surface of the base electrode 18 is also oxidized. Then, an upper layer of the N-type collector layer 16 is doped with a P-type impurity, typically ions of boron difluoride ($BF_2^+$), through the opening portion 131 for forming a link base layer. The ion implantation is performed at an acceleration energy of 10 keV to 40 keV in a dose of about $1 \times 10^{12}$ ions/cm$^2$ to $1 \times 10^{14}$ ions/cm$^2$. It is to be noted that in the subsequent figures excluding enlarged views, the illustration of the thin oxide film 132 is omitted. A resist film 89 is formed on the silicon nitride film 86 and a window 90 is formed in the resist film 89 on the region where the MIS capacitor is to be formed, by lithography.

The silicon nitride film 86, and the second and first silicon oxide films 32, 31 are etched using the resist film 89 as an etching mask. As a result, a capacitor opening portion 36 is formed in the silicon nitride film 86 and the second and first silicon oxide films 32, 31, as shown in FIG. 5F. The resist film 89 is removed.

A silicon nitride film 37 is formed by CVD to a thickness of 10 nm to 200 nm, and then a silicon oxide film 133 is formed by CVD. The impurity having doped by ion implantation is diffused by annealing, to form a link base layer 61 on the upper layer of the N-type collector layer 16 on the bottom portion of the opening portion 131. At the same time, a P$^+$-type graft base layer 62 is formed in such a manner as to be connected to the link base layer 61 by diffusion of the impurity from the base electrode 18.

A resist pattern 39 is formed by lithography on the silicon oxide film 133 on the region where the MIS capacitor is to be formed, that is, on the inner wall of the capacitor opening portion 36. The silicon oxide film 133 and the silicon nitride film 37 are subjected to anisotropic etching using the resist pattern 39 as an etching mask.

Consequently, as shown in FIG. 5G, a side wall 20 comprised of the silicon oxide film 133, silicon nitride film 37 and thin oxide film 132 is formed on the side wall of the opening portion 131, and a dielectric film 52 for capacitor, which is comprised of the silicon nitride film 37, is formed on the inner wall of the capacitor opening portion 36.

The patterned silicon oxide film 133 is placed on the dielectric film 52. The side wall 20 isolates the base electrode 18 from an emitter layer which will be formed in the subsequent step. The resist pattern 39 is then removed.

Figure 5I:
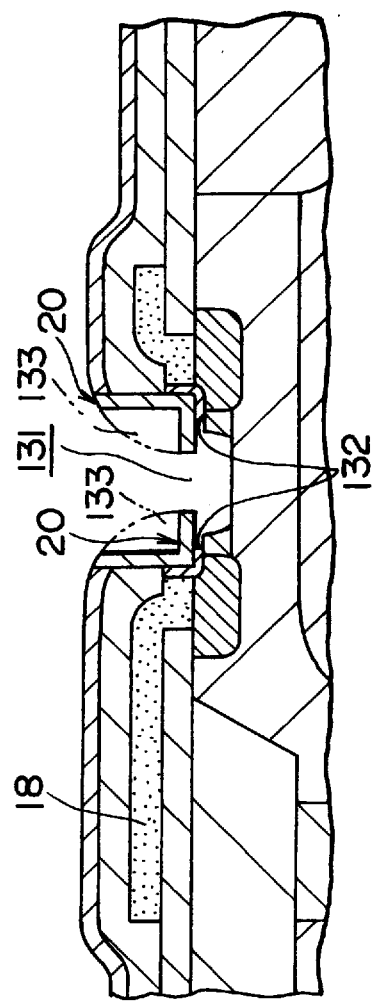

Next, as shown by the enlargement illustration of a bipolar transistor in FIGS. 5H and FIG. 5I, the link base layer 61 at a portion forming the region where the intrinsic base layer is to be formed is removed by etching (for example, isotropic etching) using the side wall 20, silicon nitride film 86 and the dielectric film 52 as a mask. Accordingly, a under cut portion is formed on the lower side of the side wall 20. In addition, the etching amount is set such that all or part of the link base layer 61 is removed. The isotropic etching is performed using a so-called SC-1 boiling liquid obtained by boiling a mixed solution of hydrogen peroxide and aqueous ammonia, or performed by an isotropic plasma etching process.

The oxide film 133 (shown by a two-dotted chain line) of the side wall 20 is removed by wet etching using fluoric acid. At this time, the thin oxide film 132 on the lower portion of the side wall 20 is also etched in the direction of the base electrode 18. As a result, the side wall 20 comprised of the silicon nitride 37 is formed into a shape overhanging in the opening portion 131. In the above wet etching, the silicon oxide film 133 (shown by a two-dotted chain line) on the region where the capacitor is to be formed is also removed.

Figure 5J:
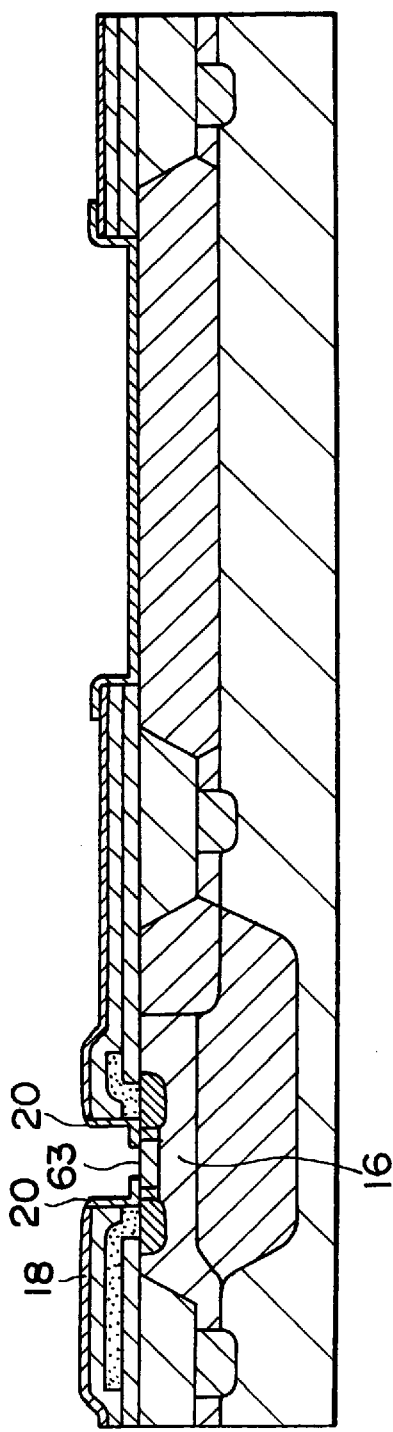
Figure 5K:
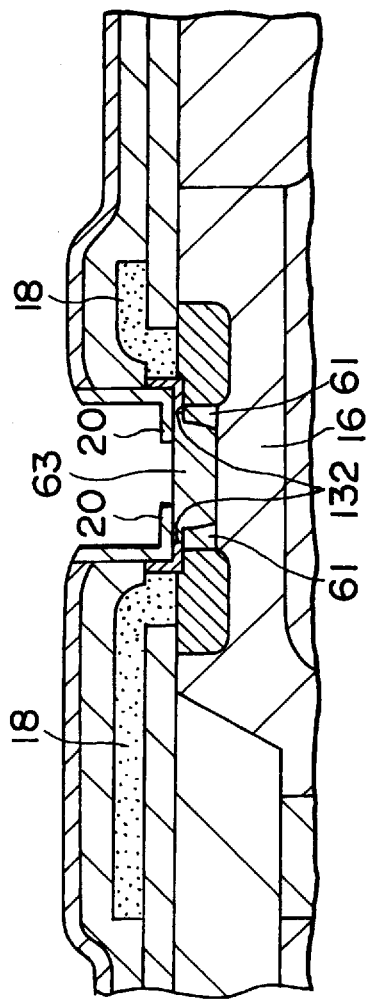

Next as shown by the enlarged illustration of a first bipolar transistor in FIG. 5J and FIG. 5K, an intrinsic base layer 63 comprised of a mixed crystal of silicon-germanium ($Si_{1-x}Ge_x$, preferably $0.05 \leq x \leq 0.3$, for example x=0.15) is formed on the N-type collector layer 16 at the portion where the link base layer 61 and the thin oxide film 132 on the lower portion of the side wall 20 are etched, by selective epitaxial growth using an ultra high vacuum chemical vapor deposition (UHV-CVD) or low pressure CVD. At this time, since part of the thin oxide film 132 on the lower portion of the side wall 20 is removed by etching using fluoric acid, the intrinsic base layer 63 is formed into a shape which protrudes on the base electrode 18 side.

Figure 5L:
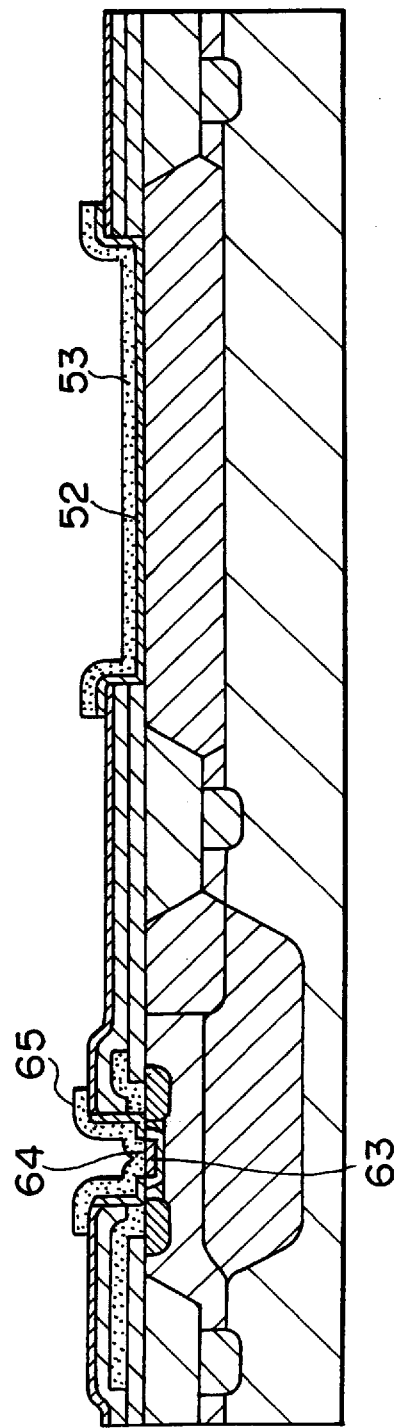

The process goes on to a step shown in FIG. 5L at which a polycrystalline silicon film highly doped with an N-type impurity is formed by CVD. The polycrystalline silicon film thus formed will be taken as an emitter electrode of an NPN transistor and an upper electrode of a MIS capacitor. The emitter annealing is then performed at a temperature of 700° C. and 1000° C. for highly diffusing the N-type impurity from the polycrystalline silicon film to the upper layer of the intrinsic base layer 63, to thus form an emitter layer 64.

A resist mask (not shown) is formed by lithography on a region where the emitter electrode is to be formed and on a region where the upper electrode of the MIS capacitor is to be formed. The polycrystalline silicon film is etched using the resist film as a mask, to form an emitter electrode 65 connected to the emitter layer 64 and also form an upper electrode 53 on the dielectric film 52. The resist mask formed by lithography is removed.

Figure 5M:
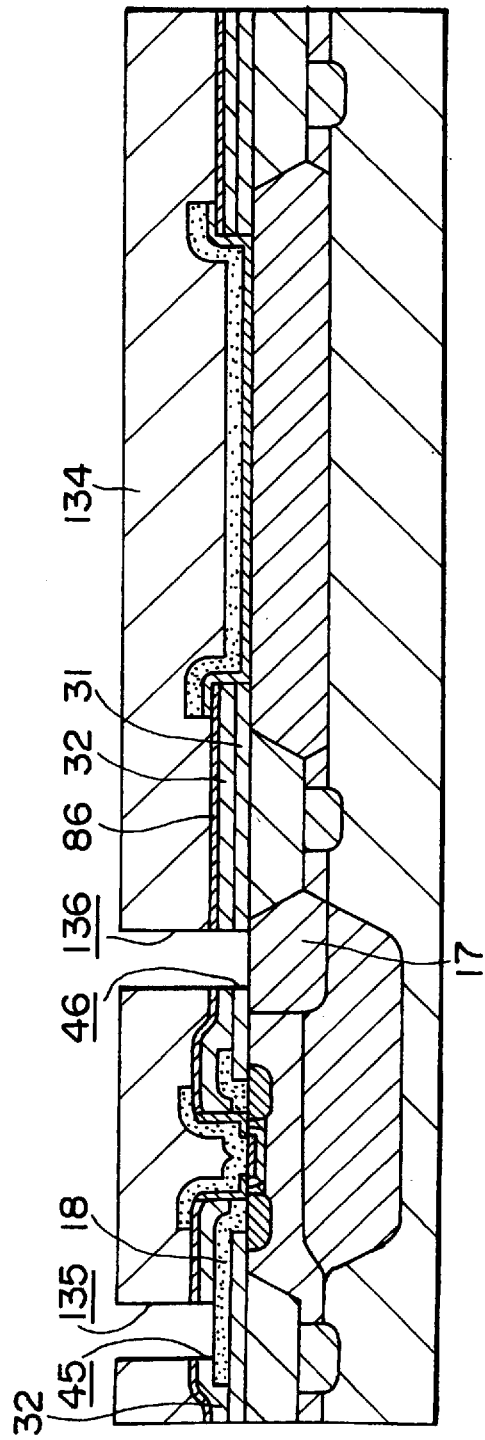

The process goes on to a step shown in FIG. 5M at which a resist film 134 is formed over the entire surface of the silicon nitride film 86 side and windows 135, 136 are formed in the resist film 134 on the base electrode 18 and the N$^+$-type plug diffusion layer 17 respectively, by lithography. The silicon nitride film 86, and the second, first silicon oxide films 32, 31, and the like are etched using the resist film 134 as a mask, to form, in the silicon nitride film 86 and the second silicon oxide film 32, a base electrode opening portion 45 communicated to the base electrode 18, and to form, in the silicon nitride film 86 and the second and first silicon oxide films 32, 31, a collector electrode opening portion 46 communicated to the N$^+$-type plug diffusion layer 17. The resist film 134 is then removed.

Figure 5N:
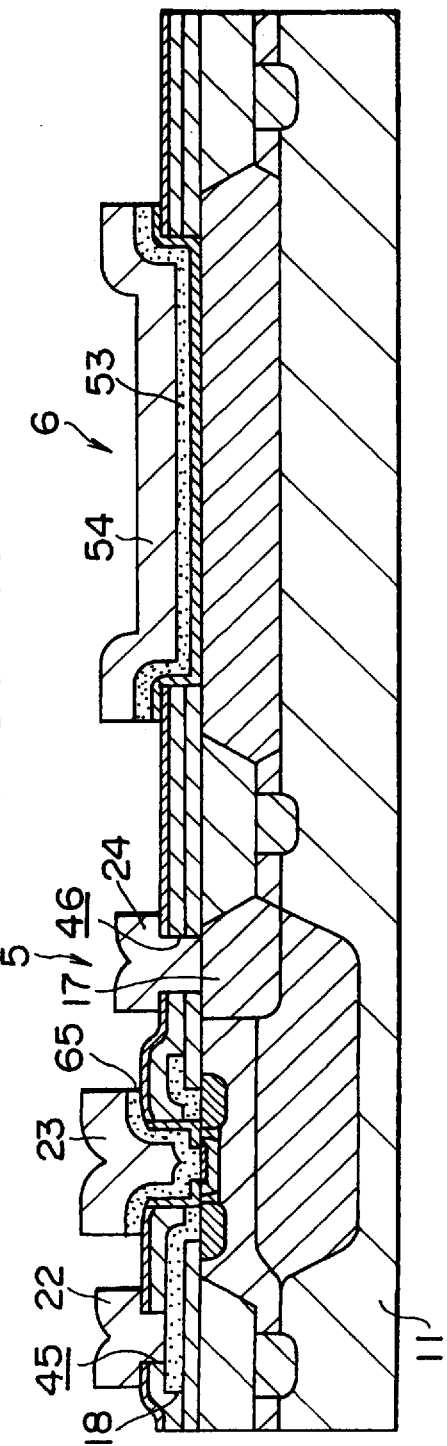
Figure 7:
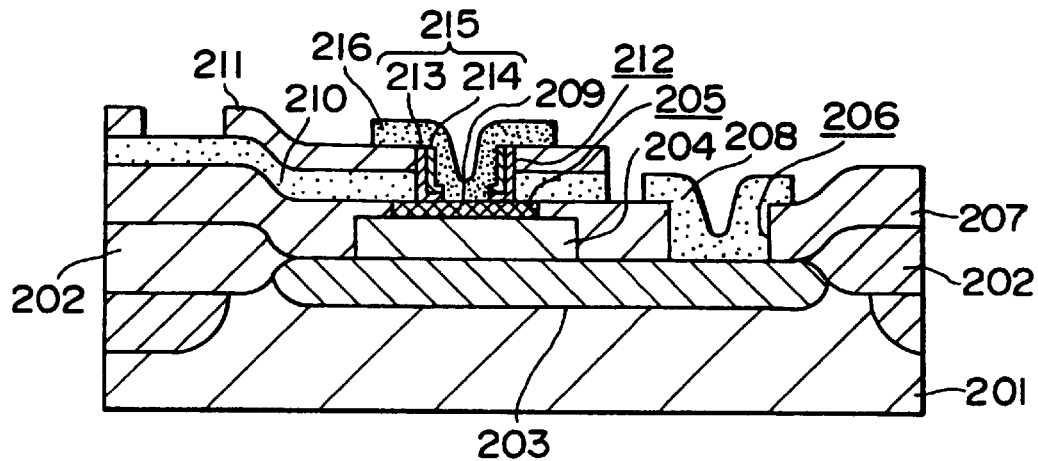
FIG. 7 is a schematic view showing a configuration of a related art heterojunction bipolar transistor.
Figure 8A:
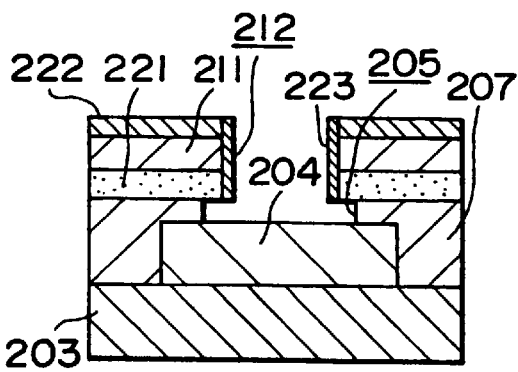
FIGS. 8A to 8C are diagrams showing steps of fabricating the related art heterojunction bipolar transistor.
Figure 8C:
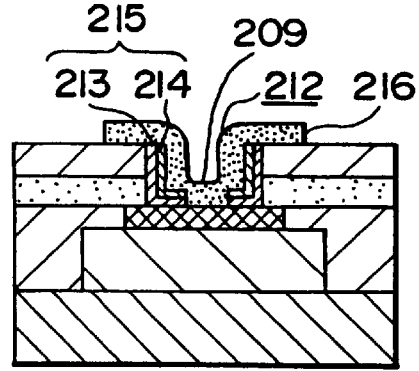
Figure 8B:
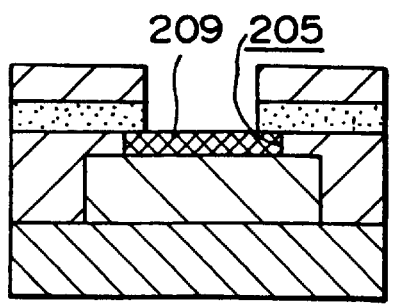

At the next step shown in FIG. 5N at which a barrier metal and an aluminum based alloy are deposited by sputtering, followed by patterning using lithography and etching. As a result, a base metal electrode 22 connected to the base electrode 18 through the base electrode opening portion 45 is formed; an emitter metal electrode 23 is formed on the emitter electrode 65; and a collector electrode 24 connected to the N$^+$-type plug diffusion layer 17 through the collector electrode opening portion 46 is formed. Moreover, an upper metal electrode 54 connected to the upper electrode 53 of the MIS capacitor is formed. In this way, an NPN bipolar transistor 5 and a MIS capacitor 6 are formed on the same silicon substrate 11.

In the fabrication process according to the third embodiment, the N$^+$-type diffusion layer 51 as the lower electrode is formed by the same ion implantation as that performed for the N$^+$-type plug diffusion layer 17. Also, the dielectric film 52 of the MIS capacitor 6 is formed of the same silicon nitride film 37 constituting the side wall 20 of the NPN bipolar transistor 5. Further, the upper electrode 53 is formed of the same polycrystalline silicon film constituting the emitter electrode 65.

Accordingly, the narrow base type heterojunction NPN bipolar transistor 5 having the intrinsic base layer 63 formed of the mixed crystal of silicon-germanium and the MIS capacitor 6 can be formed on the same silicon substrate 11 only by adding, to the steps of forming the NPN bipolar transistor 5, two lithography steps and one etching step, more specifically, adding one lithography step and one etching step for forming the capacitor opening portion 36, and another lithography step for patterning the dielectric film 52.

Thus, a high quality LSI including the NPN bipolar transistor 5 and the MIS capacitor 6 can be realized only by adding the minimum number of the fabrication steps.

Next, a fourth embodiment of the process of fabricating a semiconductor device according to the present invention will be described with reference to fabrication steps shown in FIG. 6A to FIG. 6G. In these figures, parts corresponding to those described with reference to FIG. 2A to FIG. 5N are indicated by the same reference numerals.

The same steps as those described with reference to FIG. 4A to FIG. 4D will be repeated. Thus, as shown in FIG. 6A, an N$^+$-type buried layer 12 is formed in the silicon substrate 11 in a region where a bipolar transistor is to be formed and an N-type epitaxial layer 13 is formed on the silicon substrate 11 by epitaxial growth, in accordance with the same steps as those described with reference to FIG. 4A to FIG. 4D. At this time, the N$^+$-type buried layer 12 is diffused into a lower portion of the epitaxial layer 13. An isolation oxide film 14 is formed in the epitaxial layer 13. The isolation oxide film 14 is also formed in a region where a MIS capacitor is to be formed. The epitaxial layer 13 in a region where a bipolar transistor is to be formed is taken as an N-type collector layer 16. While not shown, the silicon oxide film 82 described with reference to FIG. 2H is formed on the surface of the epitaxial layer 13.

An N$^+$-type plug diffusion layer 17 connected to the N$^+$-type buried layer 12 is formed in the epitaxial layer 13 in the region where the bipolar transistor is to formed by ion implantation. Also, a P$^+$-type isolation diffusion layer 15 is formed at a lower portion of the isolation oxide film 14 by ion implantation.

At the next step shown in FIG. 6B at which a first silicon oxide film 31 is formed by CVD over the entire surface of the N-type epitaxial layer 13 to a thickness of 50 nm to 300 nm. A base opening portion 34 is formed in the first silicon oxide film 31 on the N-type collector layer 16 by lithography and etching. Then, the resist mask formed by lithography is removed. A polycrystalline silicon film 41 is formed by CVD on the inner all of the base opening portion 34 and on the first silicon oxide film 31 to a thickness of, for example, 100 nm to 300 nm. The polycrystalline silicon film 41 is entirely doped with a P-type impurity, typically ions of boron difluoride(BF$_2^+$) by ion implantation. The ion implantation is performed at an acceleration energy of 20 keV to 100 keV in a dose of 1×10$^{14}$ ions/cm$^2$ to 1×10$^{16}$ ions/cm$^2$.

The process goes on to a step shown in FIG. 6C at which a resist film 85 is formed by lithography on a region where a base electrode is to formed and on a region where a MIS capacitor is to formed. The polycrystalline silicon film 41 is pattern by RIE using the resist film 85 as an etching mask, to leave the polycrystaline silicon film 41 on the region where the base electrode is to be formed. At the same time, a lower electrode 56 is formed of the polycrystalline silicon film 41 left in the region where the MIS capacitor is to be formed.

The resist film 85 is then removed. At the next step shown in FIG. 6D, a second silicon oxide film 32 is formed by CVD on the first silicon oxide film 31 so as to cover the patterned polycrystalline silicon film 41 and the lower electrode 56. Also, a silicon nitride film 86 is formed on the second silicon oxide film 32 by CVD. A resist film 87 is formed on the silicon nitride film 86 and a window 88 is formed in the resist film 87 on the region where a base region (intrinsic base region) is to be formed, by lithography. The silicon nitride film 86, second silicon oxide film 32, and polycrystalline silicon film 41 are etched using the resist film 87 as a mask, to form an opening portion 131. The polycrystalline silicon film 41 is referred to as a base electrode 18.

The resist film 87 is removed. The process goes on to a step shown in FIG. 6E at which a thin oxide film 132 is formed typically by oxidation on the surface of the N-type collector layer 16 on the bottom portion of the opening portion 131 to a thickness of 10 nm to 30 nm. At this time, the exposed surface of the base electrode 18 is also oxidized. Then, the upper layer of the N-type collector layer 16 is doped with a P-type impurity for forming a link base layer, typically ions of boron difluoride (BF$_2^+$), through the opening portion 131 by ion implantation. The ion implantation is performed at an acceleration energy of 10 keV to 40 keV and a dose of about 1×10$^{12}$ ions/cm$^2$ to 1×10$^{14}$ ions/cm$^2$. It is to be noted that in the subsequent figures excluding enlarged views, the illustration of the thin oxide film 132 is omitted. A resist film 89 is formed on the silicon nitride film 86 and a window 90 is formed in the resist film 89 on the region where the MIS capacitor is to be formed, by lithography.

The silicon nitride film 86, and the second and first silicon oxide films 32, 31 are etched using the resist film 89 as an etching mask. As a result, a capacitor opening portion 36 is formed in the silicon nitride film 86 and the second silicon oxide film 32, as shown in FIG. 6F. The resist film 89 is removed.

A silicon nitride film 37 is formed by CVD to a thickness of 10 nm to 200 nm, and then a silicon oxide film 133 is formed by CVD. The impurity having doped by ion implantation is diffused by annealing, to form a link base layer 61 on the upper layer of the N-type collector layer 16 on the bottom portion of the opening portion 131. At the same time, a P$^+$-type graft base layer 62 is formed in such a manner as to be connected to the link base layer 61 by diffusion of the impurity from the base electrode 18.

A resist pattern 39 is formed by lithography on the silicon oxide film 133 on the region where the MIS capacitor is to be formed, that is, on the inner wall of the capacitor opening portion 36. The silicon oxide film 133 and the silicon nitride film 37 are subjected to anisotropic etching using the resist pattern 39 as an etching mask.

After that, the same steps as those described with reference to FIGS. 5G to FIG. 5N will be repeated. Consequently, as shown in FIG. 6G, a side wall 20 comprised of the silicon oxide film 133, silicon nitride film 37 and thin oxide film 132 is formed on the side wall of the opening portion 131, and a dielectric film 52 for capacitor, which is comprised of the silicon nitride film 37, is formed on the inner wall of the capacitor opening portion 36. The patterned silicon oxide film 133 is left on the dielectric film 52. The resist pattern 39 is removed.

Next, as shown by the enlarged illustration of a bipolar transistor in FIGS. 6H and FIG. 6I, the link base layer 61 at a portion forming the region where the intrinsic base layer is to be formed is removed by etching (for example, isotropic etching) using the side wall 20, silicon nitride film 86 and the dielectric film 52 as a mask. Accordingly, a under cut portion is formed on the lower side of the side wall 20. The oxide film 133 (not shown) of the side wall 20 is removed by wet etching using fluoric acid. At this time, the thin oxide film 132 on the lower portion of the side wall 20 is also etched in the direction of the base electrode 18. As a result, the side wall 20 comprised of the silicon nitride 37 is formed into a shape overhanging in the opening portion 131. In the above wet etching, the silicon oxide film 133 (not shown) on the region where the capacitor is to be formed is also removed.

An intrinsic base layer 63 comprised of a mixed crystal of silicon-germanium ($Si_{1-x}Ge_x$, preferably $0.05 \leq x \leq 0.3$, for example x=0.15) is formed on the N-type collector layer 16 at the portion where the link base layer 61 and the thin oxide film 132 on the lower portion of the side wall 20 are etched, by selective epitaxial growth. At this time, since part of the thin oxide film 132 on the lower portion of the side wall 20 is removed by etching using fluoric acid, the intrinsic base layer 63 is formed into a shape being protruded on the base electrode 18 side.

A polycrystalline silicon film highly doped with an N-type impurity is then formed by CVD. The polycrystalline silicon film thus formed will be taken as an emitter electrode of an NPN transistor and an upper electrode of a MIS capacitor. The emitter annealing is then performed at a temperature of 700° C. and 1000° C. for highly diffusing the N-type impurity from the polycrystalline silicon film to the upper layer of the intrinsic base layer, to thus form an emitter layer 64.

A resist mask (not shown) is formed by lithography on a region where the emitter electrode is to be formed and on a region where the upper electrode of the MIS capacitor is to be formed. The polycrystalline silicon film is etched using the resist film as a mask, to form an emitter electrode 65 connected to the emitter layer 64 and also form an upper electrode 53 on the dielectric film 52. The resist mask formed by lithography is removed.

By lithography and etching, a base electrode opening portion 45 communicated to the base electrode 18 is formed in the silicon nitride film 86 and the second silicon oxide film 32, and a collector electrode opening portion 46 communicated to the $N^+$-type plug diffusion layer 17 is formed in the silicon nitride film 86 and the second and first silicon oxide films 32, 31. The resist film (not shown) formed by lithography is then removed.

A barrier metal and an aluminum based alloy are deposited by sputtering, followed by patterning using lithography and etching. As a result, a base metal electrode 22 connected to the base electrode 18 through the base electrode opening portion 45 is formed; an emitter metal electrode 23 is formed on the emitter electrode 65; and a collector electrode 24 connected to the $N^+$-type plug diffusion layer 17 through the collector electrode opening portion 46 is formed. Moreover, an upper metal electrode 54 connected to the upper electrode 53 of the MIS capacitor is formed.

In this way, an NPN bipolar transistor 7 and a MIS capacitor 8 are formed on the same silicon substrate 11. In the fabrication process according to the fourth embodiment, the lower electrode 56 and the base electrode 18 are both formed of the polycrystalline silicon film 41, and the dielectric film 52 of the MIS capacitor 8 is formed of the same silicon nitride film 37 constituting the side wall 20 of the NPN bipolar transistor 7. Moreover, the upper electrode 53 is formed of the same polycrystalline silicon film constituting the emitter electrode 65.

Accordingly, the narrow base type heterojunction NPN bipolar transistor 7 having the intrinsic base layer 63 formed of the mixed crystal of silicon-germanium and the MIS capacitor 8 can be formed on the same silicon substrate 11 only by adding, to the steps of forming the NPN bipolar transistor 1, two lithography steps and one etching step, more specifically, adding one lithography step and one etching step for forming the capacitor opening portion 36, and another lithography step for patterning the dielectric film 52. Thus, a high quality LSI including the NPN bipolar transistor 7 and the MIS capacitor 8 can be realized only by adding the minimum number of the fabrication steps.

According to the present invention, as described above, when the side walls for isolating the base electrode connected to the base layer from the emitter layer formed on the base layer are formed, the dielectric film of the MIS capacitor is formed of the film which is the same as one of the films constituting the side walls, so that the dielectric film of the capacitor is not required to be formed by a different step as in the related art process.

Further, since the upper electrode of the MIS capacitor is formed of the film which is the same as the film constituting the emitter layer, the upper electrode of the capacitor is not required to be formed by a different step; and since the lower electrode of the MIS capacitor is formed of the film which is the same as the film constituting the base electrode, the lower electrode of the capacitor is not required to be formed by a different step.

A MIS capacitor can be thus formed on one substrate together with a bipolar transistor only by adding the minimum number of steps to the steps of forming the bipolar transistor. This makes it possible to provide a high quality LSI matched with multi-media age at a low cost.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

I claim as my invention:

1. A process of fabricating a semiconductor device, comprising the steps of:

forming a base layer of a bipolar transistor over a semiconductor substrate by selective epitaxial growth; and forming a dielectric film layer of a MIS capacitor over said semiconductor substrate; and wherein at least one sidewall formed between a base electrode connected to said base layer and an emitter layer is formed over said base layer, and said sidewall further is comprised of said dielectric film layer.

2. The process of fabricating a semiconductor device according to claim 1, wherein an upper electrode of said MIS capacitor is comprised of a film layer which is also a film layer which forms said emitter layer.

3. The process of fabricating a semiconductor device according to claim 1, wherein a lower electrode of said MIS capacitor is comprised of a film layer which is also a film layer constituting said base electrode.

4. The process of fabricating a semiconductor device according to claim 2, wherein a lower electrode of said MIS capacitor is comprised of a film layer which is also a film layer constituting said base electrode.

5. The process of fabricating a semiconductor device according to claim 1, wherein said bipolar transistor is a heterojunction bipolar transistor in which said base layer is comprised of mixed crystals of silicon-germanium.

6. The process of fabricating a semiconductor device according to claim 2, wherein said bipolar transistor is a heterojunction bipolar transistor in which said base layer is comprised of mixed crystals of silicon-germanium.

7. The process of fabricating a semiconductor device according to claim 3, wherein said bipolar transistor is a heterojunction bipolar transistor in which said base layer is comprised of mixed crystals of silicon-germanium.

8. The process of fabricating a semiconductor device according to claim 4, wherein said bipolar transistor is heterojunction bipolar transistor in which said base layer is comprised of mixed crystals of silicon-germanium.

\* \* \* \* \*